US007383525B2

(12) United States Patent
Oda et al.

(10) Patent No.: US 7,383,525 B2
(45) Date of Patent: Jun. 3, 2008

(54) DESIGN REVIEW OUTPUT APPARATUS, DESIGN REVIEW SUPPORT APPARATUS, DESIGN REVIEW SYSTEM, DESIGN REVIEW OUTPUT METHOD, AND DESIGN REVIEW SUPPORT METHOD

(75) Inventors: Kazuaki Oda, Nishinomiya (JP); Hideyuki Kawashima, Nara (JP); Ichiroh Hirose, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 369 days.

(21) Appl. No.: 11/029,644

(22) Filed: Jan. 6, 2005

(65) Prior Publication Data

US 2005/0210420 A1    Sep. 22, 2005

(30) Foreign Application Priority Data

Jan. 9, 2004    (JP)    ............................ 2004-003872

(51) Int. Cl.
*G06F 17/50* (2006.01)
(52) U.S. Cl. .................... 716/11; 716/8; 716/9; 716/10
(58) Field of Classification Search ............... 716/8–11
See application file for complete search history.

(56) References Cited

U.S. PATENT DOCUMENTS

| | | | | | |
|---|---|---|---|---|---|
| 4,920,481 | A | * | 4/1990 | Binkley et al. | 703/26 |
| 5,093,797 | A | * | 3/1992 | Yotsuya et al. | 716/16 |
| 5,392,222 | A | * | 2/1995 | Noble | 716/19 |
| 5,448,496 | A | * | 9/1995 | Butts et al. | 716/16 |
| 5,453,991 | A | * | 9/1995 | Suzuki et al. | 714/724 |
| 5,475,606 | A | * | 12/1995 | Muyshondt et al. | 716/19 |
| 5,687,325 | A | * | 11/1997 | Chang | 710/104 |
| 5,903,469 | A | * | 5/1999 | Ho | 716/5 |
| 6,629,305 | B2 | * | 9/2003 | Ito et al. | 716/11 |
| 6,678,877 | B1 | * | 1/2004 | Perry et al. | 716/15 |
| 6,691,296 | B1 | * | 2/2004 | Nakayama et al. | 716/15 |
| 6,928,625 | B2 | * | 8/2005 | Makinen | 715/822 |
| 6,966,039 | B1 | * | 11/2005 | Bartz et al. | 716/1 |
| 7,039,536 | B2 | * | 5/2006 | Nagata et al. | 702/70 |
| 7,051,311 | B2 | * | 5/2006 | Tomita et al. | 716/13 |

(Continued)

FOREIGN PATENT DOCUMENTS

JP    9-34925    2/1997

(Continued)

*Primary Examiner*—Jack Chiang
*Assistant Examiner*—Naum B Levin
(74) *Attorney, Agent, or Firm*—McDermott Will & Emery LLP

(57) ABSTRACT

A design-review-output apparatus comprising: an identification unit 14 that, based on circuit information, which correlates and contains target-object identifiers that identify target objects of a circuit, and design-review information, which contains attributes for target design-review objects for each one or more design-review items in a circuit board design, identifies target-object identifiers that correspond to the target design-review items; an image-creation unit 16 that, based on the target-object identifiers identified by the identification unit 14 and board information that correlates the target-object identifiers with the position on the board of the target objects identified by the target-object identifiers, creates a design-review image that includes an image of the target design-review objects on the board; and an output unit 17 that outputs that design-review image.

12 Claims, 20 Drawing Sheets

U.S. PATENT DOCUMENTS

| | | | |
|---|---|---|---|
| 7,240,317 B2 * | 7/2007 | Ito et al. | 716/11 |
| 2002/0042904 A1 * | 4/2002 | Ito et al. | 716/8 |
| 2002/0133786 A1 * | 9/2002 | Weis | 716/1 |
| 2003/0056182 A1 * | 3/2003 | Rosenbaum | 716/1 |
| 2005/0172252 A1 * | 8/2005 | Cheng et al. | 716/10 |

FOREIGN PATENT DOCUMENTS

JP    11-330784    11/1999

* cited by examiner

FIG.4

| ID | TARGET-OBJECT CLASSIFICATION | TARGET-OBJECT IDENTIFIER | ATTRIBUTE | ATTRIBUTE VALUE |
|---|---|---|---|---|
| 1 | CIRCUIT ELEMENT | IC8001 | NAME | TL7040 |
|   |   |   | GRAPHIC SYMBOL | CMP001 |
| 2 | CIRCUIT-ELEMENT PIN | P1-IC8001 | WIRING TARGET-OBJECT IDENTIFIER | NET101 |
| 3 | CIRCUIT-ELEMENT PIN | P2-IC8001 | WIRING TARGET-OBJECT IDENTIFIER | NET102 |
| 4 | CIRCUIT-ELEMENT PIN | P3-IC8001 | WIRING TARGET-OBJECT IDENTIFIER | NET103 |
| 5 | CIRCUIT-ELEMENT PIN | P4-IC8001 | WIRING TARGET-OBJECT IDENTIFIER | NET104 |
| 6 | CIRCUIT-ELEMENT PIN | P5-IC8001 | WIRING TARGET-OBJECT IDENTIFIER | NET105 |
| 7 | CIRCUIT-ELEMENT PIN | P6-IC8001 | WIRING TARGET-OBJECT IDENTIFIER | NET106 |
| 8 | CIRCUIT-ELEMENT PIN | P7-IC8001 | WIRING TARGET-OBJECT IDENTIFIER | NET107 |
| 9 | CIRCUIT-ELEMENT PIN | P8-IC8001 | WIRING TARGET-OBJECT IDENTIFIER | NET108 |
| 10 | CIRCUIT ELEMENT | X001 | NAME | CL8901 |
|   |   |   | GRAPHIC SYMBOL | CIP001 |
| 11 | CIRCUIT-ELEMENT PIN | P1-X001 | WIRING TARGET-OBJECT IDENTIFIER | NET101 |
| 12 | CIRCUIT-ELEMENT PIN | P2-X001 | WIRING TARGET-OBJECT IDENTIFIER | NET102 |
| 13 | WIRING | NET101 | NETKIND | CLOCK |
| 14 | WIRING | NET102 | NETKIND | CLOCK |
| 15 | WIRING | NET103 | NETKIND | DIGITAL |
| 16 | WIRING | NET104 | NETKIND | DIGITAL |
| 17 | WIRING | NET105 | NETKIND | POWER |
| 18 | WIRING | NET106 | NETKIND | ANALOG |
| 19 | WIRING | NET107 | NETKIND | ANALOG |
| 20 | WIRING | NET108 | NETKIND | GND |
| 21 | WIRING | NET109 | NETKIND | ANALOG |
| 22 | WIRING | NET110 | NETKIND | ANALOG |
|   | ⋮ | ⋮ | ⋮ | ⋮ |

FIG.5

| ID | REVIEW-POINT INFORMATION | TARGET DESIGN-REVIEW OBJECT ATTRIBUTE | DISPLAY-METHOD INFORMATION |
|---|---|---|---|
| 1 | SEPARATE ANALOG WIRING AND DIGITAL WIRING. | ANALOG | ANALOG: BLUE |
| | | DIGITAL | DIGITAL: RED |
| 2 | MINIMIZE WIRING FROM A CRYSTAL. | CRYSTAL | SELECT |
| 3 | PLACE ICS ON THE TOP SURFACE OF THE BOARD IN THE CENTER OF THE BOARD. | IC (TOP SURFACE) | RED |

FIG.6A

| GRAPHIC-SYMBOL IDENTIFIER | TARGET-OBJECT IDENTIFIER | PLACEMENT SURFACE | ANGLE | X | Y |
|---|---|---|---|---|---|
| FIC001 | IC8001 | TOP | 0 | 50 | 30 |
| FX001 | X001 | TOP | 180 | 45 | 70 |
| FR1 | R1 | TOP | 270 | 10 | 35 |
| FR2 | R2 | BOTTOM | 270 | 20 | 60 |
| ⋮ | ⋮ | ⋮ | ⋮ | ⋮ | ⋮ |

FIG.6B

| TARGET-OBJECT IDENTIFIER | TYPE | PLACEMENT SURFACE | THICKNESS | X | Y | X' | Y' |
|---|---|---|---|---|---|---|---|
| NET101 | LINE | TOP | 1 | 70 | 45 | 90 | 45 |
| NET101 | LINE | TOP | 1 | 90 | 45 | 90 | 65 |
| NET101 | LINE | TOP | 1 | 90 | 65 | 30 | 65 |
| NET101 | LINE | TOP | 1 | 30 | 65 | 30 | 70 |
| NET106 | LINE | TOP | 1 | 30 | 35 | 20 | 35 |
| NET106 | LINE | TOP | 1 | 20 | 35 | 20 | 40 |
| NET106 | CIRCLE | TOP | 3 | 20 | 40 | – | – |
| ⋮ | ⋮ | ⋮ | ⋮ | ⋮ | ⋮ | ⋮ | ⋮ |

ANALOG
DIGITAL

FIG.14

| TARGET-OBJECT IDENTIFIER | PLACEMENT SURFACE |
|---|---|
| IC8001 | TOP |
| X001 | TOP |
| R1 | TOP |
| R2 | BOTTOM |
| NET101 | TOP |
| NET106 | TOP |
| ⋮ | ⋮ |

FIG.15

| TARGET DESIGN-REVIEW OBJECT ATTRIBUTE | ATTRIBUTE INFORMATION (COMMAND) |
|---|---|
| ANALOG | SELECT (NETKIND, ANALOG) |
| DIGITAL | SELECT (NETKIND, DIGITAL) |
| CRYSTAL | SELECT(REFID,"X*") |
| IC | SELECT(REFID,"IC*") |
| . . . . | . . . . |

FIG.16

| ID | REVIEW-POINT INFORMATION | TARGET DESIGN-REVIEW OBJECT ATTRIBUTE | DISPLAY METHOD | TARGET-OBJECT IDENTIFIER | DISPLAY COMMAND |
|---|---|---|---|---|---|
| 1 | SEPARATE ANALOG WIRING AND DIGITAL WIRING. | ANALOG | BLUE | NET106 NET107 NET109 NET110 | SETCOLOR(NET106, BLUE) SETCOLOR(NET107, BLUE) SETCOLOR(NET109, BLUE) SETCOLOR(NET110, BLUE) |
|  |  | DIGITAL | RED | NET103 NET104 | SETCOLOR(NET103, RED) SETCOLOR(NET104, RED) |
| 2 | MINIMIZE WIRING FROM A CRYSTAL. | CRYSTAL | SELECT | X001 | SELECT(X001) |
| 3 | PLACE ICS ON THE TOP SURFACE OF THE BOARD IN THE CENTER OF THE BOARD. | IC (TOP SURFACE) | RED | IC8001 | SETCOLOR(IC8001, RED) |

FIG.17

| DISPLAY METHOD | DISPLAY-COMMAND-CREATION FUNCTION |
|---|---|
| BLUE | FUNC01( ) |
| RED | FUNC02( ) |
| SELECT | FUNC03( ) |
| .... | .... |

DESIGN REVIEW OUTPUT APPARATUS, DESIGN REVIEW SUPPORT APPARATUS, DESIGN REVIEW SYSTEM, DESIGN REVIEW OUTPUT METHOD, AND DESIGN REVIEW SUPPORT METHOD

BACKGROUND OF THE INVENTION

1. Field of the Invention

This invention relates to a design-review-output apparatus that outputs a design-review image for performing design review related to circuit board design.

2. Description of the Related Art

Conventionally, in circuit board design, in order to prevent poor product quality, technology has been developed to automatically perform the work of checking the design according to specified rules (for example, refer to Japanese unexamined patent publication No. H11-330784 (Pg. 1, FIG. 1), and Japanese unexamined patent publication No. H9-34925 (Pg. 1, FIG. 1).

However, whether or not there are problems in any of the specified check items related to the circuit board design must be checked by performing a design review. The design review referred to here is a visual check of the designed board. In this design review, since checking is performed visually, there is a problem in that something may be overlooked.

Particularly, in the case where the design review is performed by a person who is new at design review and is still inexperienced, there is a good possibility that an item or object to be checked will be overlooked. Therefore, whether the design review can be performed accurately or not largely depends on the skill and experience of the person performing the design review.

SUMMARY OF THE INVENTION

In order to solve the problems mentioned above, the object of this invention is to provide a design-review-output apparatus that is capable of properly performing design review.

In order to accomplish the aforementioned object, the design-review-output apparatus of this invention comprises: a circuit-information-memory unit that stores circuit information that correlates and contains target-object identifiers, which identify target objects of a circuit, and attributes of those target objects; a design-review-information-memory unit that stores design-review information that contains attributes for target design-review objects, which are target objects for which design review is to be performed, for one or more design-review items related to a circuit board design; an identification unit that identifies the target-object identifiers that correspond to the target design-review objects, based on the circuit information and the design-review information; a board-information-memory unit that stores board information that correlates and contains target-object identifiers and positions on the board of the target objects that are identified by the target-object identifiers; an image-creation unit that, based on the target-object identifiers identified by the identification unit and the board information, creates a design-review image, which is an image that includes the target design-review objects on the board; and an output unit that outputs the design-review image that was created by the image-creation unit.

With this kind of construction, it is possible to use the output design-review image to perform design review of the target design-review objects, and thus it is possible to properly perform design review related to the target design-review objects.

Also, it is possible for the design-review-output apparatus of this invention to further comprise a design-review-item-judgment unit that, according to an instruction from a user, determines which design-review items have been selected; and where the output unit outputs a design-review image that corresponds to the design-review items that the design-review-item-judgment unit determined were selected by the user.

With this kind of construction, it is possible to output a design-review image related to the design-review items selected by the user. Therefore, it is possible for the user to view the desired design-review items on a display or the like.

Moreover, in the design-review-output apparatus of this invention, the design-review information is correlated with the attributes of the target design-review objects, and contains display-method information that indicates the display method related to the target design-review objects; and the image-creation unit, based on the display-method information, can create the design-review image that includes the target design-review objects.

With this kind of construction, it is possible to use the display method corresponding to the target objects to display the target design-review objects on the design-review image; for example, by setting the target design-review objects to be a different color than the other target objects, it is possible to easily check the position of the target design-review objects and the relationship with the other target objects. As a result, it is possible to perform design review quickly and greatly reduce the possibility of overlooking something.

Also, the design-review-output apparatus of this invention can be such that the target-object attributes include the attributes 'Analog' and 'Digital'; the display-method information indicates a method for displaying 'Analog' and 'Digital' such that they are distinguishable from other target design-review objects; and the image-creation unit creates a design-review image such that a target review-design object whose attribute is 'Analog', and target design-review object whose attribute is 'Digital' are distinguishable from other target design-review objects.

With this kind of construction, it becomes possible for even an inexperienced user to clearly know at once the problem points where noise occurs easily at locations near analog wiring and digital wiring.

Also, the design-review-output apparatus of this invention may be such that the design-review information contains review-point information that indicates review points related to the target design-review objects, for each the design-review item; and the output unit outputs the review-point information that corresponds with the target design-review objects together with outputting the design-review image.

With this kind of construction, by performing output based on review-point information, it is possible for the person performing the design review to know the design-review points (points for attention); for example, it becomes possible for even an inexperienced user to properly perform design review.

The design-review-support apparatus of this invention comprises: a design-review-information-memory unit that stores design-review information that contains attributes of target design-review objects, which are target objects for which design review is to be performed, for one or more design-review items related to a circuit board design; and an attribute-information-output unit that outputs attribute information that indicates the target design-review object attributes.

With this kind of construction, for example, it is possible to perform design review properly by outputting a design-review image that contains the target design-review objects corresponding to attributes indicated by attribute information that is received by an apparatus for receiving that attribute information.

Moreover, it is possible for the design-review-support apparatus of this invention to further comprise: an identifier-receiving unit that, according to the output of the attribute information, receives target-object identifiers that identify the target design-review objects corresponding to the target design-review object attributes that are indicated by the attribute information; a target-object-display-information-creation unit that creates target-object-display information that includes the target-object identifiers that were received by the identifier-receiving unit; and a target-object-display-information-output unit that outputs the target-object-display information that was created by the target-object-display-information-creation unit.

With this kind of construction, it is possible to output target-object-display information that includes the target-object identifiers for the target design-review objects; and, for example, it becomes possible to properly perform design review by displaying the target design-review objects corresponding to the target-object identifiers by an apparatus that receives that target-object-display information.

Furthermore, the design-review-support apparatus of this invention can be such that the attribute information is a command to output the target-object identifiers that correspond to the target design-review object attributes to the design-review-support apparatus.

With this kind of construction, it is possible to give an instruction by the command to output the target-object identifiers corresponding to the attributes of the target design-review objects; and, for example, it becomes possible to perform design review properly by using the command which has been preset for the apparatus receiving the attribute information together with using other existing apparatus resources.

Also, it is possible for the design-review-support apparatus to further comprise a board-layer-information-memory unit that stores board-layer information that indicates the layer on the circuit board where a target object is located; and where attributes related to the layer where the target design-review objects are located are also included in the attributes for the target design-review objects; and the target-object-display-information-creation unit creates target-object-display information that, of the target-object identifiers that were received by the identifier-receiving unit, includes the target-object identifiers for which the layer where the target design-review object indicated by the attributes corresponding to the target-object identifiers is located, matches the layer where that target design-review object indicated by the board-layer information is located.

With this kind of construction, when attributes that are related to the layer where the target design-review objects are located are included in the design-review information, it is possible to create and output target-object display information that corresponds to the attributes.

Moreover, it is possible for the design-review-support apparatus of the invention to be such that the design-review information is correlated with the attributes of the target design-review objects and includes display-method information related to a display method for displaying the target design-review objects; and the target-object-display-information-creation unit creates target-object-display information that includes the display-method information that corresponds to the target-object identifiers included in the target-object-display information.

With this kind of construction, it is possible to create target-object-display information based on display-method information such that target design-review objects are displayed; and, for example, when target design-review objects are displayed based on that target-object-display information, it becomes possible to easily check the position of the target design-review objects, and the relationship between the target design-review objects and other target objects.

Furthermore, the design-review-support apparatus of this invention can be such that the target-object-display information is a command for displaying the target objects identified by the target-object identifiers that are included in that target-object-display information using a display method indicated by the display-method information corresponding to the target-object identifiers.

With this kind of construction it is possible to output target-object-display information according to the command; and, for example, it is possible to perform design review properly by using a command that is preset for the apparatus that receives the target-object-display information, while at the same time using other existing apparatus resources.

Also, in the design-review-support apparatus of this invention it is also possible for the target-object-display-information-output unit to output target-object-display information for each the design-review item.

With this kind of construction, it is possible to perform design review for each design review item.

Moreover, the design-review-support apparatus of this invention can further comprise a design-review-item-judgment unit that, according to an instruction from the user, determines which design-review items were selected; and where the target-object-display-information-output unit outputs target-object-display information corresponding to the design-review items that the design-review-item-judgment unit determined were selected by the user.

With this kind of construction, it is possible to output target-object-display information related to the target design-review items selected by the user. Therefore, it is possible for the user to view desired design-review items on a display or the like.

Furthermore, the design-review-support apparatus of this invention can be such that the design-review information contains review-point information that indicates review points related to the target design-review objects for each design-review item; and the target-object-display-information-creation unit creates target-object-display information that includes the review-point information corresponding to the target-object identifiers included in the target-object-display information.

With this kind of construction, it is possible for the person performing design review to know the design-review points (points for attention); and, for example, it becomes possible for even an inexperienced user to perform design review properly.

By adopting this kind of construction, this invention makes it possible to perform design review properly by emphasizing the display (for example highlighting) of target design-review objects, which are target objects for which design review is being performed, based on design-review information.

These and other objects, characteristics and advantages of the invention will made more clear by explaining them in detail below with reference to the supplied drawings.

BRIEF DESCRIPTION OF THE DRAWINGS

FIG. 4 is a drawing showing an example of the circuit information of the first embodiment.

FIG. 5 is a drawing showing an example of the design-review information of the first embodiment.

FIGS. 6A and 6B are drawings showing an example of the board information of the first embodiment.

FIG. 14 is a drawing showing an example of the board-layer information of the second embodiment.

FIG. 15 is a drawing showing an example of the correspondence between attributes and commands in the second embodiment.

FIG. 16 is a drawing showing an example of the correspondence between the display method and display-command-generation function in the second embodiment.

FIG. 17 is a drawing showing an example of the target-object-display information in the second embodiment.

DESCRIPTION OF THE PREFERRED EMBODIMENTS

First Embodiment

The design-review-output apparatus of a first embodiment of the invention is explained with reference to the drawings. The design-review-output apparatus of this embodiment is an apparatus that creates and outputs a design-review image that contains the target objects of the design review based on design-review information.

Figure 1:
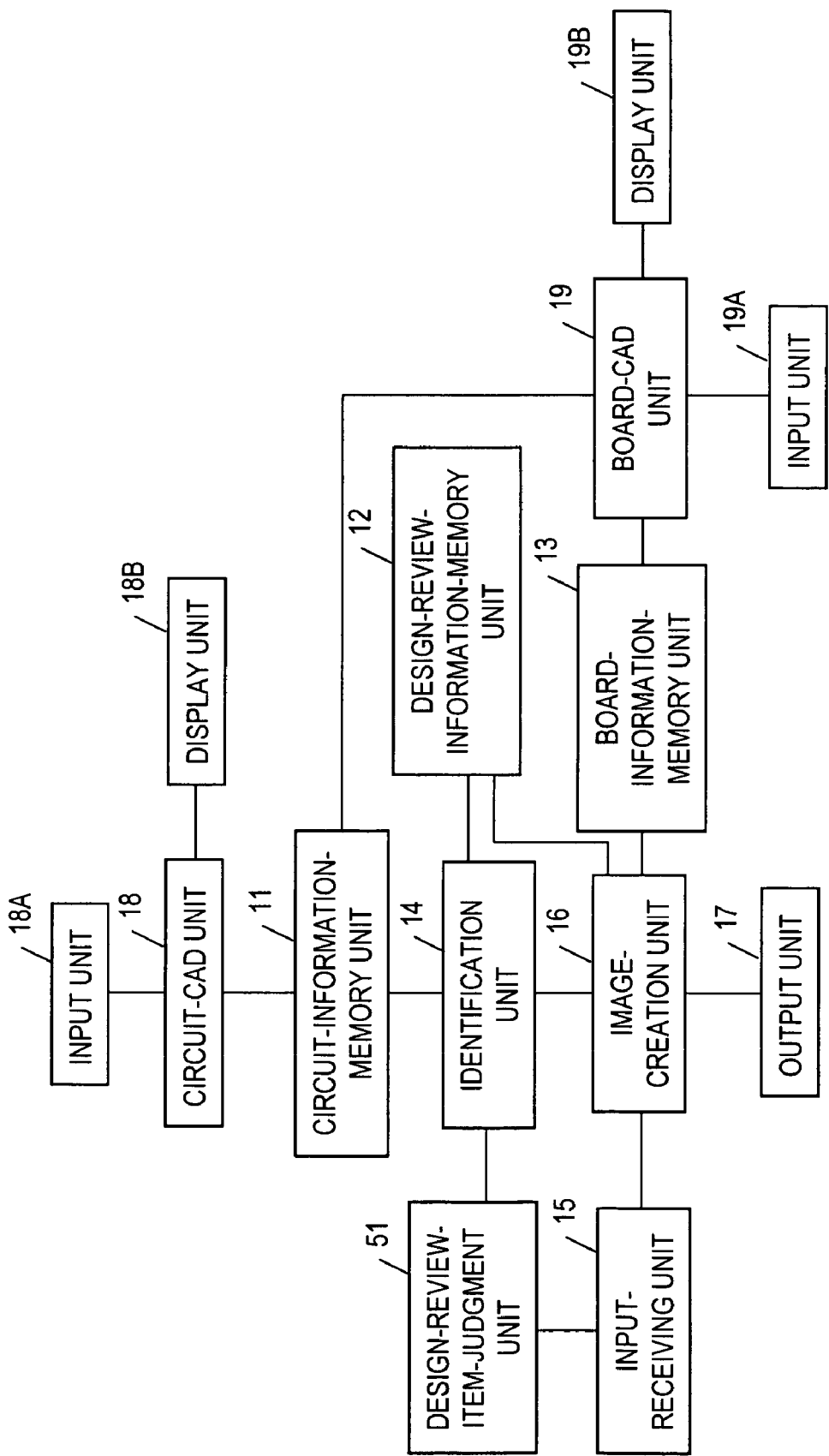
FIG. 1 is a block diagram showing the construction of the design-review-output apparatus of a first embodiment of the invention.

FIG. 1 is a block diagram showing the construction of the design-review-output apparatus of this embodiment of the invention. In FIG. 1, the design-review-output apparatus comprises: a circuit-information-memory unit 11, a design-review-information-memory unit 12, board-information-memory unit 13, identification unit 14, input-receiving unit 15, image-creation unit 16, output unit 17, circuit-CAD unit 18, input unit 18a, display unit 18b, board-CAD 19, input-unit 19a, display unit 19b, and design-review-item-judgment unit 51.

Figure 7:
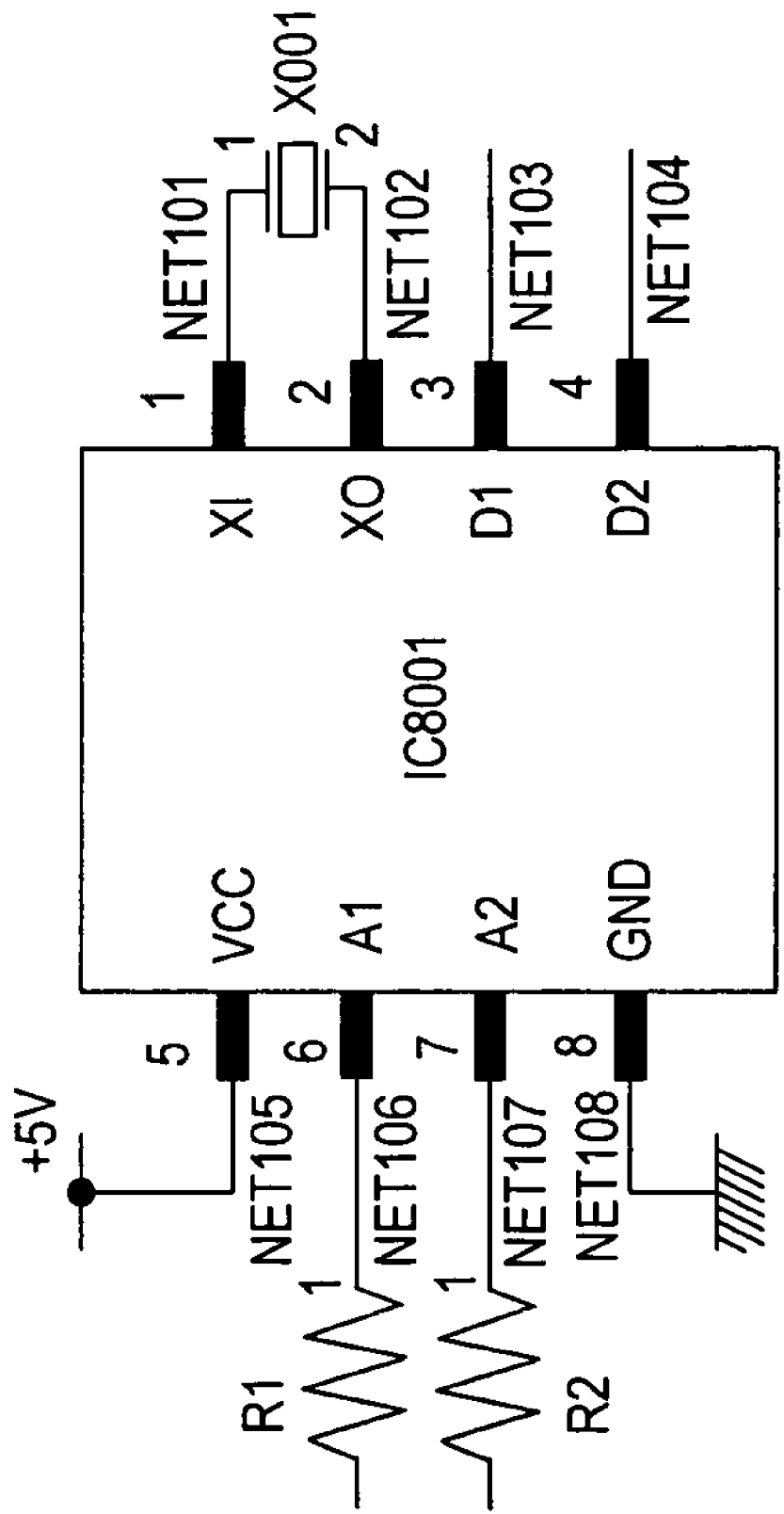
FIG. 7 is a drawing showing an example of the circuit diagram of the first embodiment.

The circuit-information-memory unit 11 stores circuit information. Here, the circuit information is information that correlates the target-object identifiers, which identify the target objects in a circuit, with attributes for those target objects. The target objects in a circuit are component elements of the circuit and include, for example, circuit elements such as ICs, transistors, resistors, crystals, capacitors, etc., pins for those circuit elements (for example, pins for the bi-polar transistor emitter terminals, etc.), wiring for the circuit, or combinations of these. The attributes of the target objects include, the classification of the target objects (for example, whether the target object is a circuit element, or wiring, etc.), the name of the target object (for example, the part number of the target object), the type of target object (for example, whether the target object is a IC, or crystal, etc.), and the like. An attribute can be indicated by information that corresponds to the contents of the attribute (for example, 'crystal'), or an attribute can be indicated according to specific rules (for example, 'X' in the case when there is a rule that a crystal corresponds to 'X'). The correlation between a target-object identifier and attribute can be performed using a specific table of target-object identifiers and information indicating the attributes, or can be performed by including information in the target-object identifier itself that contains information indicating the attribute. It is possible to construct a so-called circuit diagram (for example, a diagram as shown in FIG. 7) by using this circuit information.

The design-review-information-memory unit 12 stores design-review information. Here, the design-review information is information containing attributes for the target objects of the design-review for each one or more design-review items related to a circuit board design. This design-review information is correlated with the attributes of the target design-review objects, and contains display-method information. It also contains review-point information for each design-review item. The display-method information is information that indicates the display method related to the target design-review objects. The review-point information is information indicating points (points for attention) when performing design review related to target design-review objects, and this review-point information indicates for which target objects that design review is to be performed, or what points require attention during the design review. The design-review items of the designed board are items for which design review is to be performed. The target design-review objects, are objects for which design review is to be performed. Also, how a target design-review object will be displayed on the display or in print (printed material) is indicated by the display method in the display-method information. This display method, for example, is the method for emphasizing and displaying a target design-review object, or more specifically, is a method for displaying a specific target object using a specific color (for example, displaying objects in red or blue), or a method for displaying just a specific target object, or a method for having just a specific target object flash, or having areas other than the specific target object displayed dimly, or a method of enlarging and displaying focusing on a specific target object. Design-instruction information for each design-review item can also be contained in this design-review information. Design instructions are instructions related to a board design for creating board information from circuit information. This design-instruction information can be information that is the same as the review-point information, or can be different information. Different information could be information such as an instruction for a specific circuit element (for example, minimizing the wiring from X001 to IC8001).

The board-information-memory unit 13 stores board information. Here, the board information is information that correlates target-object identifiers with the position of the target object on the board identified by the target-object identifier. It is possible to create a so-called board-pattern diagram (such as the diagram shown in FIG. 10) by using this board information. Here, the board-pattern diagram is a diagram that shows the circuit elements that are wired on that wiring pattern. However, when displayed based on the display method indicated in the display-method information, specific circuit elements and wiring do not need to be displayed. The board-CAD unit 19 designs this board information based on the circuit information.

The circuit-information-memory unit 11, design-review-information-memory unit 12 and board-information-memory unit 13 can be realized using a specific recording medium (for example, semi-conductor memory, magnetic disk, optical disk, or the like). The memory such as that of the circuit-information-memory unit 11 can be a temporary memory such as RAM for circuit-information that is read from an external storage device, or can be long-term memory such as a magnetic disk. Moreover, of the circuit-information-memory unit 11, design-review-information-memory unit 12, and board-information-memory unit 13, two or more memory units can be realized by the same recording medium. In that case, for example, the area in which the circuit information is stored becomes the circuit-information-memory unit 11.

The identification unit 14 identifies a target-object identifier corresponding to a target design-review object based on design-review information stored by the design-review-information-memory unit 12. It does not matter whether this identification is performed by extracting (acquiring) the target-object identifier from the circuit information, or performed by setting a specific flag for the target-object identifier in the circuit information. In this embodiment, the case in which the identification unit 14 extracts the target-object identifier will be explained.

The input-receiving unit 15 receives input such as specific instructions. The input-receiving unit 15, for example, can receive input from an input device (for example, a keyboard, mouse, touch panel, etc.), or can receive input that is sent by way of a wired or wireless communications circuit.

The image-creation unit 16 creates a design-review image, which is an image that contains the target design-review objects on the board, based on the target-object identifier that is identified by the identification unit 14 and the board information that is stored in the board-information-memory unit 13. Creation of this design-review image is performed such that the target design-review objects that are to be contained in the design-review image are displayed based on display-method information corresponding to those target design-review objects. The image-creation unit 16 also creates a review-point image, which is an image that indicates the review points, based on the review-point information corresponding to the attributes of the target design-review objects. The design-review image and the review-point image can be the same image, or can be separate images. The same image referred to here, is an image in which part of the image is the design-review image, and the other part of the image is the review-point image. This design-review image is an image that is created such that when displayed by a display device or printed out by a printer, a person looking at the image can easily identify the location of the target design-review objects, and their relationship with other target objects.

The output unit 17 outputs the design-review image that was created by the image-creation unit 16. The output unit 17 also outputs the review-point image that was created by the image-creation unit 16. Here, this output can be a display on a display device (for example, a CRT or liquid crystal display), a transmission to a specific device by way of a communications line, or printing by a printer. The output unit 17 may include or not include a device that performs output (for example, a display device, printer, etc.). Also, the output unit 17 can be realized by hardware, or can be realized by software such as the driver that drives these devices. In this embodiment, the output unit 17 performs a display on the display device.

In this embodiment, the case in which the output unit 17 outputs the review-point image created by the image-creation unit 16 will be explained. Together with outputting the design-review image, the output unit 17 can perform output based on review-point information that corresponds to the attributes of the target design-review objects. In other words, the output unit 17 can also perform output such as audio (for example, audio that is read text of the review-point information) based on review-point information.

The circuit-CAD unit 18 receives input that was input by the user from the input unit 18a, and creates a circuit diagram on the screen of the display unit 18b, and creates circuit information that corresponds to that created circuit diagram. The circuit-CAD unit 18 creates the circuit information that is stored in the circuit-information-memory unit 11.

The input unit 18a is a unit for performing input by the user, and for example, is a keyboard, mouse or the like. The display unit 18b is a unit for displaying the circuit diagram, and for example, is a CRT, crystal display, or the like.

The board-CAD unit 19 receives the input that is input by the user from the input unit 19a, and reads information from the circuit information stored in the circuit-information-memory unit 11 related to connections of the circuit elements. Next, based on the read information, the board-CAD unit 19 creates a board-pattern diagram according to certain control operations performed on the screen of the display unit 19b. This board-CAD unit 19 creates the board information that is stored in the board-information-memory unit 13.

The input 19a is a unit for performing input by the user, and for example, is a keyboard, mouse or the like.

The display unit 19b is a unit for displaying the board-pattern diagram, and for example, is a CRT, liquid crystal display, or the like.

The design-review-item-judgment unit 51 determines, according to an instruction from the user that is received by the input-receiving unit 15, which design-review items have been selected. Also, the design-review-item-judgment unit 5 gives the judgment result to the identification unit 14. This selection of design-review items can be a selection of one design-review item, or a selection of two or more design-review items.

Figure 2:
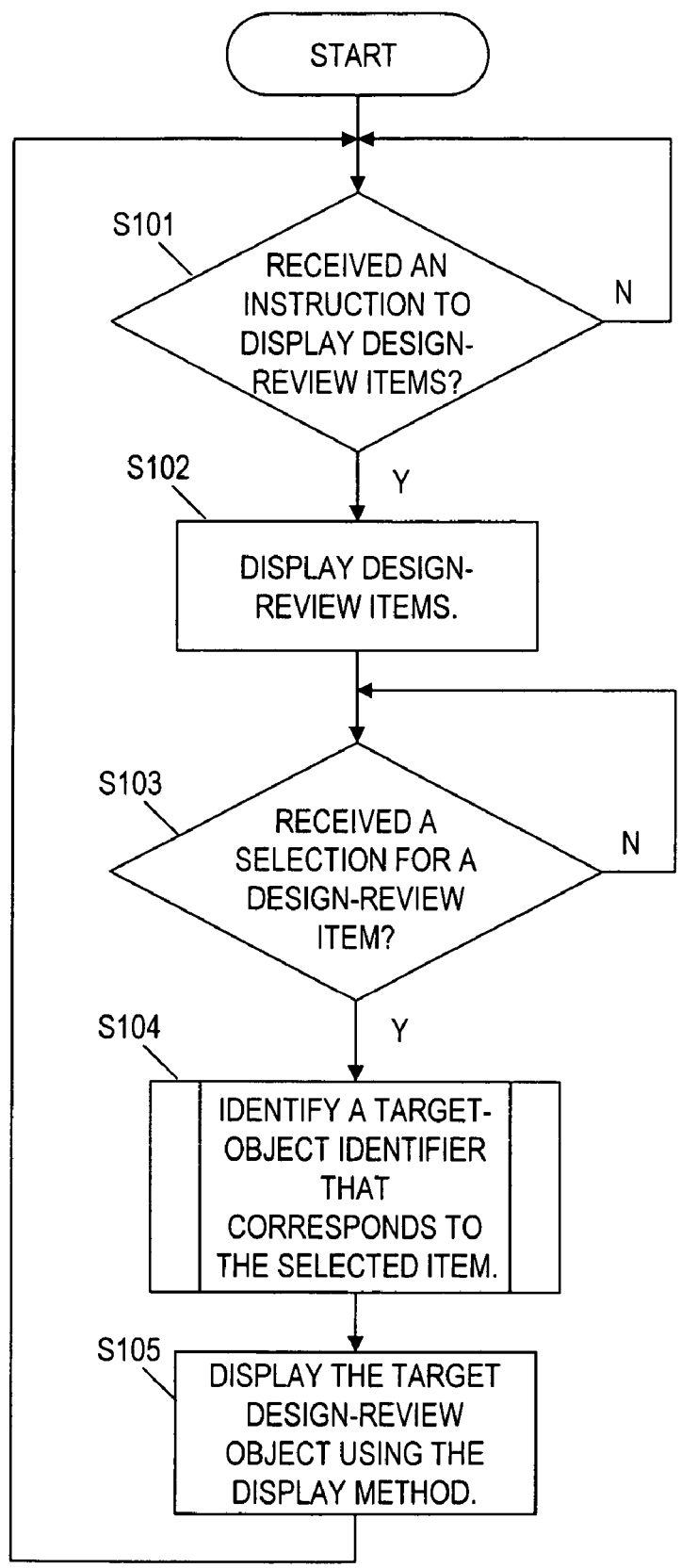
FIG. 2 is a flowchart showing the operation of the design-review-output apparatus of the first embodiment.
Figure 3:
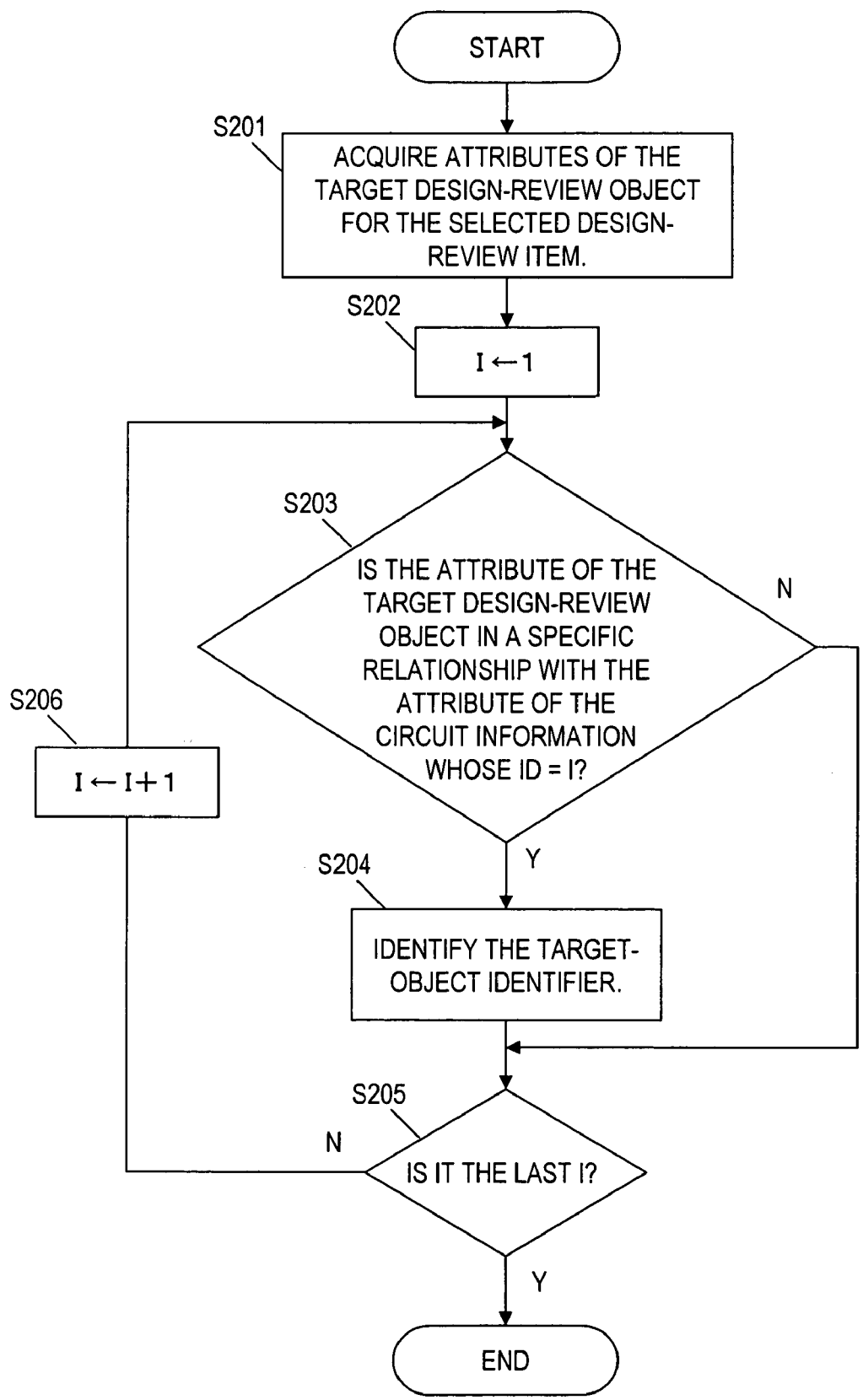
FIG. 3 is a flowchart showing the operation of the design-review-output apparatus of the first embodiment.

Next, FIG. 2 and FIG. 3 will be used to explain the operation of the design-review-output apparatus of this embodiment.

(Step S101) The input-receiving unit 15 determines whether or not an instruction has been received to display a design-review item. When an instruction has been received to display a design-review item, the input-receiving unit 15 gives that instruction to the image-creation unit 16 and the processing advances to step S102, however, when an instruction has not been received, the process repeats step S101 until that instruction is received.

(Step S102) After receiving the instruction from the input-receiving unit 15 to display a design-review item, the image-creation unit 16 reads each of the design-review items from the design-review information that is stored in the design-review-information memory unit 12. Also, the image-creation unit 16 creates an image for displaying a list of those read design-review items. The output unit 17 displays the image that was created by the image-creation unit 16 on the display device.

(Step S103) The input-receiving unit 15 determines whether or not an instruction has been received to select a design-review item from the list of design-review items that were displayed in step S102. When an instruction has been received to select a design-review item, the input-receiving unit 15 gives that instruction to the design-review-item-judgment unit 51. The design-review-item-judgment unit 51 determines, according to an instruction from the user that was received by the input-receiving unit 15, whether a design-review item has been selected. The design-review-item-judgment unit 51 then gives that judgment result to the identification unit 14, and the processes advances to step S104. When the input-receiving unit 15 does not receive an instruction to select a design-review item, the process repeats step S103 until that input is received.

(Step S104) In accordance to the judgment result received from the design-review-item-judgment unit 51, the identification unit 14 acquires an attribute for the target design-review object that corresponds to the design-review item selected by the user from the design-review information stored by the design-review-information-memory unit 12. Also, based on that attribute, the identification unit 14 identifies the target-object identifier in the circuit information that is stored in the circuit-information-memory unit 11. This process will be described in detail later.

(Step S105) Based on the target-object identifier that was identified by the identification unit 14 and the board information that is stored in the board-information-memory unit 13, the image-creation unit 16 creates a design-review image that contains the target design-review object that corresponds to the identified target-object identifier. Here, creation of this design-review image is performed based on the display method that corresponds to the design-review item indicated by the selection result in step S103. Also, the image-creation unit 16 creates a review-point image based on the review-point information that corresponds to the design-review item indicated by the selection result in step S103. Moreover, the design-review image and review-point image are given to the output unit 17 and displayed by the display device. The process then returns to step S101.

In the flowchart shown in FIG. 2, the process ends when the power is turned OFF or there is an interrupt ending the process.

Next, the flowchart in FIG. 3 will be used to explain the processing in detail of step S104 in FIG. 2.

(Step S201) The identification unit 14 receives a judgment result from the design-review-item-judgment unit 51 indicating which design-review item was selected, and acquires the attribute from the design-review information for the target design-review object that corresponds to the selected design-review item.

(Step S202) The identification unit 14 sets the count I to 1.

(Step S203) The identification unit 14 determines whether or not the attribute acquired in step S201 has a specific relationship with the attribute of a record of circuit information having the ID=I. Here, this specific relationship is when they match or when they are in an inclusive relationship. Being in an inclusive relationship is, for example, when the attribute acquired in step S201 is 'Analog', and the attribute of the record having the ID=I is 'High Analog Frequency'. In this case, the attribute 'High Analog Frequency' is determined to be included in the attribute 'Analog'. The judgment of whether or not the attributes are in a specific relationship can be performed based on special rules stored by the identification unit 14 (for example, rules that the attributes diode and transistor are included in the attribute semiconductor element), or can be performed by determining whether part of the character strings related to the attributes match. Also, when the attributes are in a specific relationship, the process advances to step S204, and when they are not in a specific relationship, the process advances to step S205.

(Step S204) The identification unit 14 identifies the target-object identifier for the record of circuit information having ID=I. This identification can be performed, for example, by extracting that target-object identifier from the circuit information.

(Step S205) The identification unit 14 determines whether or not the record of circuit information having ID=I is the last record in the circuit information. When that record is the last record, the process ends, otherwise the process advances to step S206.

(Step S206) The identification unit 14 increases the count I by an increment of 1. The process then returns to step S203.

Next, a detailed example will used to explain the operation of the design-review-output apparatus of this embodiment. In recent years, as the demand for digitization and miniaturization of all kinds of products increases, it has become particularly common for circuit design to be performed by combining conventional analog technology with digital technology. However, since digital signals have many signal components that have a large effect on analog signals, when both kinds of wiring are near each other, noise occurs in the analog signal. When noise occurs in the analog signal, unlike the case of a digital signal, correction becomes difficult, so for example, in a video signal or audio signal, that noise is perceptibly reproduced during reproduction. Therefore, it is preferable that that circuit be designed such that analog circuits (wiring) and digital circuits (wiring) are separated from each other as much as possible. The intensity of the noise that enters analog wiring from digital wiring is known to be inversely proportional to the square of the distance between the wiring. From this aspect as well, it is particularly important that design review be performed for digital and analog wiring. Therefore, in this detailed example, the case is explained in which 'Separate analog wiring and digital wiring' is selected as the design-review item to be described later.

In this example, FIG. 4 shows the circuit information that is stored in the circuit-information-memory unit 11. In the circuit information shown in FIG. 4, each record contains the target-object classification, target-object identifier, attributes, and attribute values. When the target-object classification is 'Circuit Element', the 'Name' and 'Graphic Symbol' correspond to the attributes. Here, the name corresponds to the part number, etc. of that circuit element, and even though the target-object identifiers may differ, the same name is used for the same circuit elements. Moreover, the graphic symbol is a graphic symbol that is used when displaying that circuit element on the circuit diagram. The data for that graphic symbol is stored in the circuit-information-memory unit 11. When the target-object classification is 'Circuit Element Pin', 'Wiring Target-object Identifier' corresponds to the attribute. From this wiring target-object identifier, it is possible to know to which wire the circuit element pin is connected. When the target-object classification is 'Wiring', 'netkind' corresponds to the attribute. From this netkind, it is possible to know the kind of wiring. For example, when the netkind is 'Clock', it is known that the wiring used is for supplying a clock signal, and when the netkind is 'Digital', it is known that the wiring carries a digital signal.

Moreover, FIG. 5 shows the digital-review information stored by the design-review-information-memory unit 12. The design-review information shown in FIG. 5 comprises records for each design-review item, and each design-review item contains 'Review-point Information', 'Target Design-review Object Attribute' and 'Display-method Information'. The review-point information is information that indicates instructions (know how) related to the design review. The target design-review object attribute is an attribute of the target design-review object. The target design-review object having this attribute is the target object of the design review. The display-method information is information indicating the method for displaying the target design-review object.

Also, FIGS. 6A and 6B show the board information that is stored in the board-information-memory unit 13. FIG. 6A is information in the board information that is related to circuit elements. In FIG. 6A, each record contains a 'Graphic-symbol Identifier', 'Target-object Identifier', 'Placement Surface', 'Angle', 'X' and 'Y'. The graphic-symbol identifier is an identifier that identifies the graphic symbol for the circuit element to be displayed on the board-pattern diagram. The data for the graphic symbol identified by this graphic-symbol identifier is stored in the board-information-memory unit 13. The placement surface indicates the surface of the board on which the circuit element is placed. The surface of the board may be just one surface, the top or bottom of the board, or may be two surfaces, the top and bottom of the board; and when the board comprises multiple layers, there may be one or more layers between the top surface and/or bottom surface of the board. The angle is the angle when displaying the graphic symbol corresponding to the graphic-symbol identifier. X and Y are coordinate values that indicate the display position when displaying the graphic symbol that corresponds to the graphic-symbol identifier, and they respectively correspond to the value on the X-axis and value on the Y-axis. Here, the origin is set as the lower left of the board, and the X-axis is the horizontal axis, and the Y-axis is the vertical axis.

FIG. 6B is information in the board information that is related to wiring. In FIG. 6B, each record contains a 'Target-object Identifier', 'Type', 'Placement Surface', 'Thickness', 'X', 'Y', 'X'' and 'Y''. The type indicates the type of wiring, 'line' indicates a straight line, and 'circle' indicates a circular plane. The thickness indicates the thickness of the wire, or the radius of a circle. The X, Y, X' and Y' are coordinates, where X and X' correspond to values on the X-axis, and Y, Y' correspond to values on the Y-axis. When the type is a 'line', then 'X, Y' is the starting point of the line, and 'X', Y'' is the ending point of the line; and when the type is a 'circle', 'X, Y' is the center of the circle.

Also, FIG. 7 is a circuit diagram corresponding to the circuit information given in FIG. 4.

Figure 8:
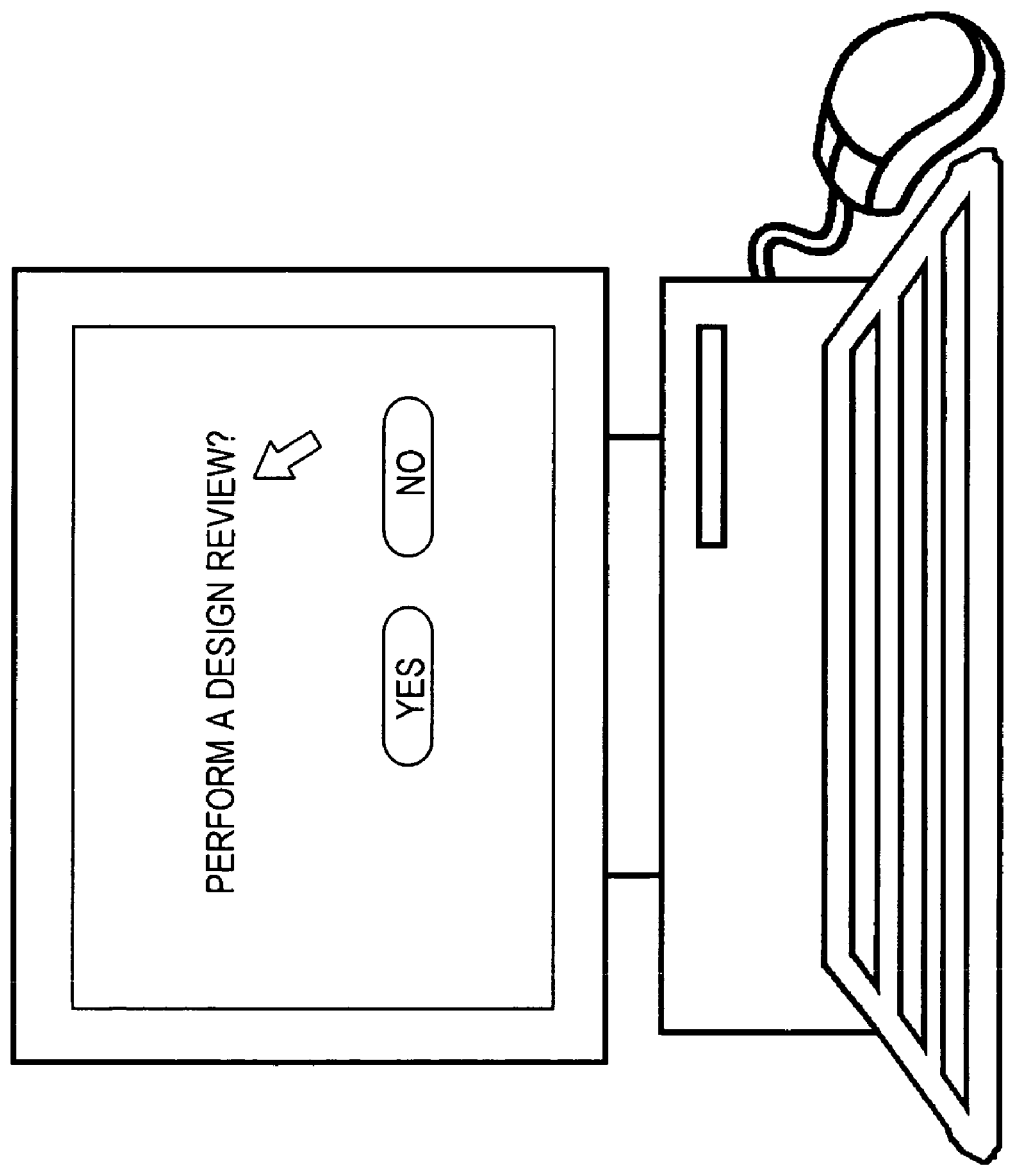
FIG. 8 is a drawing showing an example of the outward appearance of the design-review-output apparatus of the first embodiment.
Figure 9:
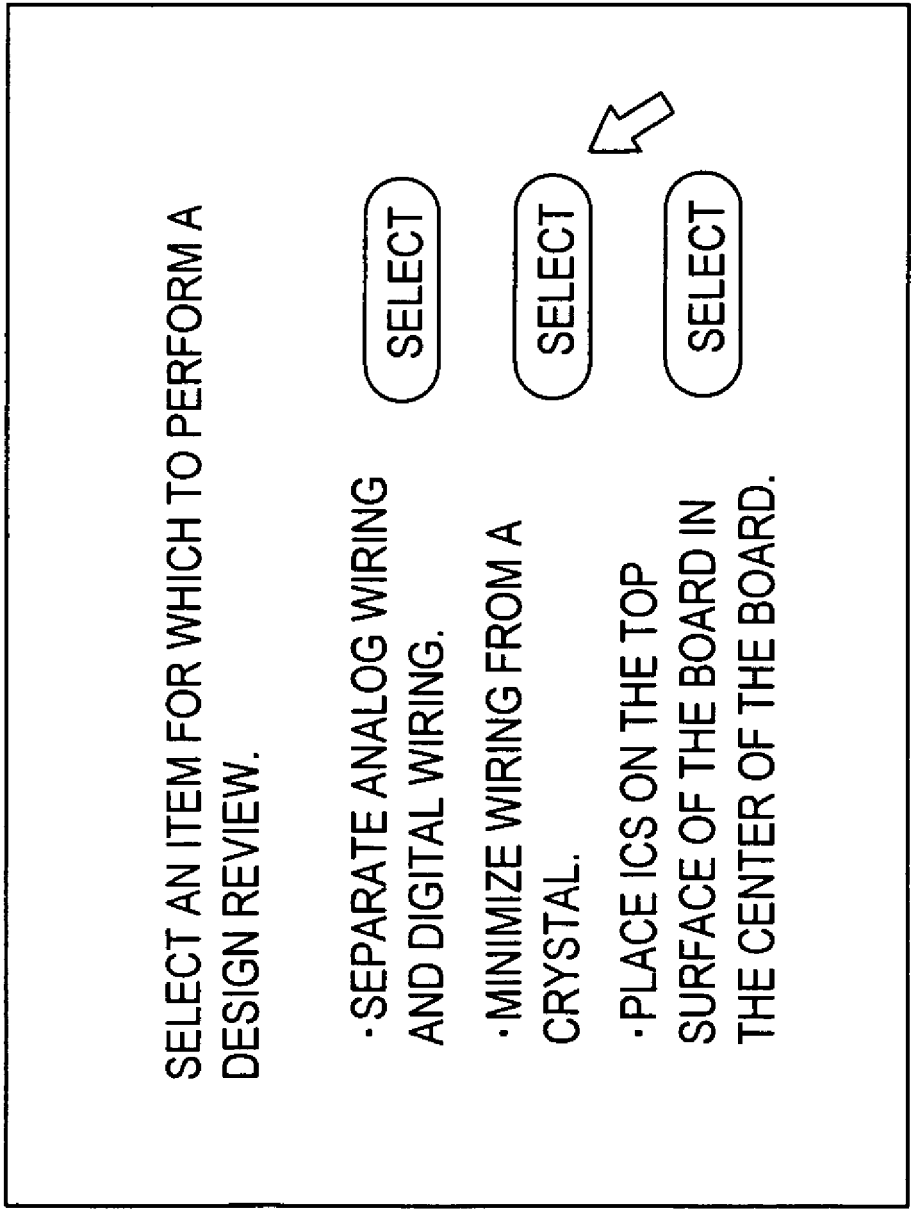
FIG. 9 is a drawing showing an example of the display of the first embodiment.

FIG. 8 is a drawing showing the outward appearance of the design-review-output apparatus of this embodiment. When the user operates the PC (Personal Computer), the screen shown in FIG. 8 is displayed. When the user operates the mouse and clicks on the 'Yes' button, the input-receiving unit 15 determines that an instruction has been received to display a design-review item (step S101), and gives that instruction to the image-creation unit 16. The image-creation unit 16 references the design-review information shown in FIG. 5 that is stored in the design-review-information-memory unit 12, and creates an image for displaying a list of design-review items. Also, the output unit 17 displays that image (step S102). FIG. 9 is a drawing showing the display of that list of design-review items. In FIG. 9, 'Review-point Information' contained in the design-review information is displayed. The user clicks on the 'Selection' button corresponding to the review point 'Separate Analog Wiring and Digital Wiring'. After doing so, the input-receiving unit 15 gives that selection instruction over to the design-review-item-judgment unit 51.

The design-review-item-judgment unit 51 determines that the first design review item, or in other words, the design-review item whose ID=1 has been selected (step S103), and notifies the identification unit 14 to identify the target-object identifier related to the design-review item whose ID=1. The identification unit 14 then identifies the target-object identifier corresponding to that selected design-review item (step S104).

More specifically, the identification unit 14 references the design-review information and acquires the attributes for ID=1, or in other words, 'Digital' and 'Analog' (step S201). Moreover, the identification unit 14 first references the record of circuit information whose ID=1, and determines that 'Analog' and 'Digital' are not included as attributes for ID=1 (steps S202, S203). Next, the identification unit 14 references records of circuit information whose ID=2 or higher, and determines whether or not 'Analog' and 'Digital' are included in those records (steps S205, S206, S203). The attribute value for the record of circuit information whose ID=15 is 'Digital', so the identification unit 14 determines that the attribute 'Digital' of the target design-review object is in a specific relationship with the attribute for the record of circuit information whose ID=15, or in other words, determines that the attributes match (step S203), and extracts the target-object identifier 'NET103' from that record (step S204). In this way, the identification unit 14 determines whether or not the attributes 'Analog' or 'Digital' are included in the records of circuit information up to the last record of circuit information (steps S203 to S206). Finally, the identification unit 14 extracts the target-object identifiers 'NET103' and 'NET104' that correspond to the attribute 'Digital', and the target-object identifiers 'NET106', 'NET107', 'NET109' and 'NET110' that correspond to the attribute 'Analog' (step S204).

Figure 10:
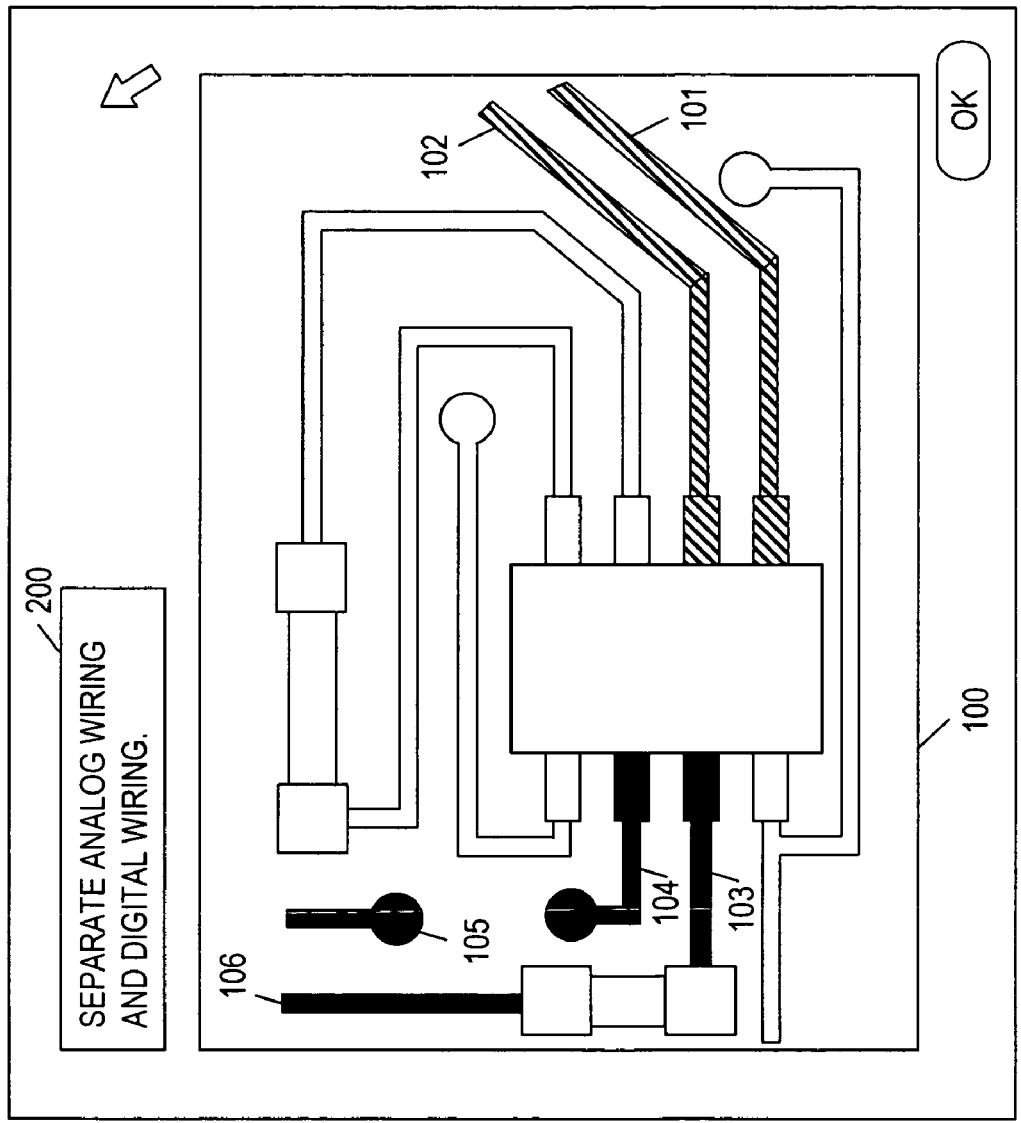
FIG. 10 is a drawing showing an example of the display of the first embodiment.

The identification unit 14 gives the extracted target-object identifier to the image-creation unit 16. After doing so, the image-creation unit 16 reads the display-method information indicating that analog be displayed in blue and digital be displayed in red, and reads the review-point information from the record of design-review information whose ID=1. Also, the image-creation unit 16 reads board information from the board-information-memory unit 13, and based on that board information, creates a design-review image showing the board-pattern diagram. The image-creation unit 16 creates a design-review image such that the target design-review objects that are identified by the target-object identifiers 'NET103' and 'NET104' corresponding to 'Digital' and that were received from the identification unit 14 are displayed in red, and the target design-review objects that are identified by the target-object identifiers 'NET106', 'NET107', 'NET109' and 'NET110' corresponding to 'Analog' are displayed in blue. The image-creation unit 16 creates the image such that the other circuit elements and wiring are displayed in black. Also, the image-creation unit 16 creates a review-point image based on the review-point information. The image-creation unit 16 gives that design-review image to the output unit 17, and the output unit 17 displays the image on the PC display (step S105). FIG. 10 is a drawing showing the design-review image 100 and review-point image 200 that are displayed on the display. In FIG. 10, the digital wiring 101, 102 is displayed in red and the analog wiring 103, 104, 105, 106 is displayed in blue. The user who looks at this display can easily check whether or not the blue wiring and red wiring are separated. In this case, the analog wiring and digital wiring are separated, so it is possible to determine that the board design is proper. The user then clicks on the 'OK' button to return to the display shown in FIG. 8.

Figure 11:
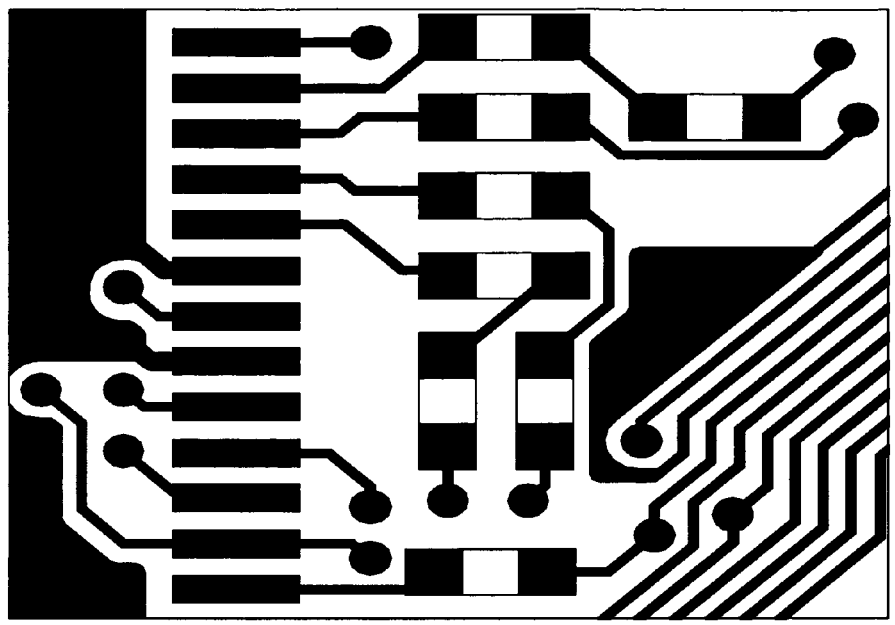
FIGS. 11A and 11B are drawings showing an example of the display related to the digital and analog wiring in the first embodiment.
Figure 11:
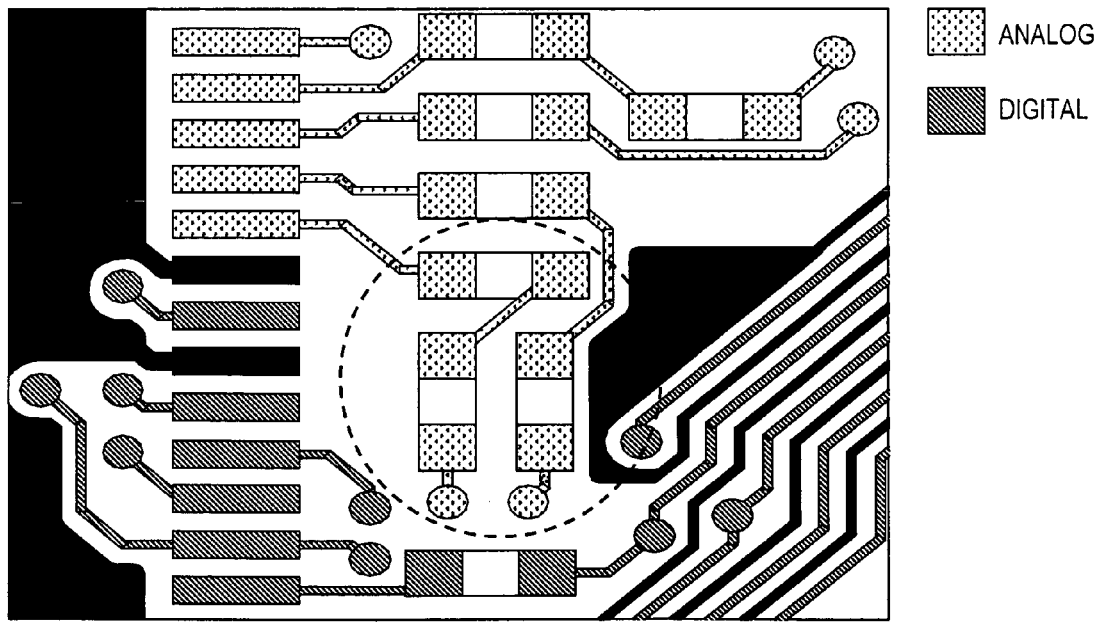

Also, FIGS. 11A and 11B show another example of a display related to digital and analog wiring. In this example, when the review-point information 'Separate Analog Wiring and Digital Wiring' is not selected, then as shown in FIG. 11A, it is very difficult for an inexperienced user to be able to distinguish between the analog wiring and digital wiring in the circuit. However, when 'Separate Analog Wiring and Digital Wiring' is selected, it becomes possible for even an inexperienced user to quickly and accurately know that there is a problem of noise occurring at the location near the dashed circle in FIG. 11B, where the analog wiring is near the digital wiring.

Processing for the design-review item related to crystals or the design-review item related to ICs is performed in the same way as for the design-review item related to digital and analog wiring. In this case, the record in the circuit information starting from the target-object identifier 'X' corresponds to the crystals, and the record starting from the target-object identifier 'IC' corresponds to ICs. Here, in the case of the design-review item related to ICs, 'Top Surface' is included in the attributes, so the image-creation unit 16 checks by referencing the board information whether or not the target-object identifier 'IC8001' identified by the identification unit 14 exists on the 'Top Surface'. In this case, from the board information shown in FIG. 6A, it can be seen that the target design-review item corresponding to the target-object identifier 'IC8001' is located on the top surface (TOP), so as in the case of other design-review items, the image-creation unit 16 creates a design-review image.

As described above, the design-review-output apparatus of this embodiment, creates and outputs a design-review image that includes the target design-review object corresponding to the design-review item, making it possible to quickly and accurately perform a design review. In other words, since it is possible for the person performing the design review to quickly find the location of the target design-review object on the board, it becomes possible to more quickly perform the design review. Moreover, by emphasizing the display of the target design-review object, it is possible to prevent overlooking the target design-review object, and thus it is possible to perform the design review more accurately.

Particularly, by creating a design-review image that includes the target design-review object based on display-method information, it is possible to emphasize and display the target design-review object according to that display-method information, and thus it is possible to easily distinguish that target object from other target objects. As a result, it is possible to prevent overlooking the target design-review object.

Also, by performing output based on review-point information, it is possible for the person performing the design review to know what the design-review item is, and thus it is possible to prevent overlooking the item to be checked, making it possible to perform the design review more accurately. Moreover, since it is possible to know from that review point what kind of point to check, it becomes possible for even an inexperienced user to perform a design review.

Also, by way of the design-review-item-judgment unit 51 and output unit 16, the user is able to display the design review that corresponds to a specific design-review item. Therefore, it is possible for the user to perform a design review for just a desired design-review item.

In this embodiment, the case was explained in which after selecting the design-review item, the target-object identifiers were identified and the target design-review object was displayed. It is also possible to identify the target-object identifiers for all or a plurality of design-review items in advance, and then select the design-review item and display the selected target design-review object. In that case, the design-review-item-judgment unit 51 can give the judgment result to the image-creation unit 16 or output unit 17.

The output unit 17 can finally perform output according to the judgment result from the design-review-item-judgment unit 51, without asking how to handle the output according to that judgment result. In other words, by having the identification unit 14 perform identification according to the judgment result, output can be performed according to the judgment result. Also, by having the image-creation unit 16 create an image based on the judgment result, it is possible to perform output according to the judgment result. Moreover, by having the output unit 17 perform output of the design-review image or the like according to the judgment result, it is possible to perform output according to the judgment result.

Also, in this embodiment, the case in which both the display-method information and review-point information where stored in the design-review-information-memory unit 12 was explained. However, it is possible for the design-review-information-memory unit 12 to store just one or neither one. In the case where the design-review-information-memory unit 12 does not store the review-point information, output is not performed based on the review-point information. Moreover, when the design-review-information-memory unit 12 does not store the display-method information, the image-creation unit 16 creates an image for displaying the target design-review object that was identified by the identification unit 14 using a preset display method. For example, the image-creation unit 16 creates an image for emphasizing and displaying the target design-review object identified by the identification unit 14. Here, the emphasized display is set in advance by the image-creation unit 16, and this means for example, that it is set to display the identified target design-review object in a different color than other target objects, or to display just the identified target design-review object without displaying the other target objects, or to display the target design-review object only by highlighting it only.

Furthermore, in the detailed example of this embodiment, first, based on the board information, the image-creation unit 16 checks which layer of the board a specific target design-review object exists. Also, the case was explained in which, when the layer indicated by the board information where the target design-review object is located matches the layer indicated by the attributes of that target design-review object, the image-creation unit 16 creates a design-review image that includes that target design-review object. However, it is also possible for the image-creation unit 16 to create a design-review image based on information other than the layer information in the board information. For example, when the position on the board of the target design-review object is included in the attribute for that target design-review object, and the position indicated by that attribute is in a specific relationship with the position indicated by the board information, it is possible for the image-creation unit 16 to create a design-review image that includes that target design-review object. The 'specific relationship' referred to here is, for example, when the positions match, or when the positions match within a specified tolerance range.

Also, in this embodiment, the case in which the design-review-output apparatus comprises a circuit-CAD unit 18 and board-CAD unit 19 was explained, however, it is also possible for the design-review-output apparatus to comprise of neither unit, or of just one of the units. Also, it possible to construct an apparatus that is separate from the design-review-output apparatus that comprises both the circuit-CAD unit 18 and board-CAD unit 19 or comprises just one of the two units, such that it can exchange information with the circuit-information-memory unit 11 and board-information-memory unit 13 by way of a specified communications line or specified recording medium. Moreover, in the case of the input units 18a, 19a and display units 18b, 19b that are connected to the circuit-CAD unit 18 and board-CAD unit 19, by obtaining circuit information and board information by way of the a specified communications line or specified recording medium, it is possible for the apparatus to comprise of only some of the units or none of the units. Furthermore, it is possible to use the output unit 17 as the display unit, and it is also possible to use the input received by the input-receiving unit 15 as the user input.

Second Embodiment

The design-review system of a second embodiment of the invention will be explained with reference to the drawings.

Figure 12:
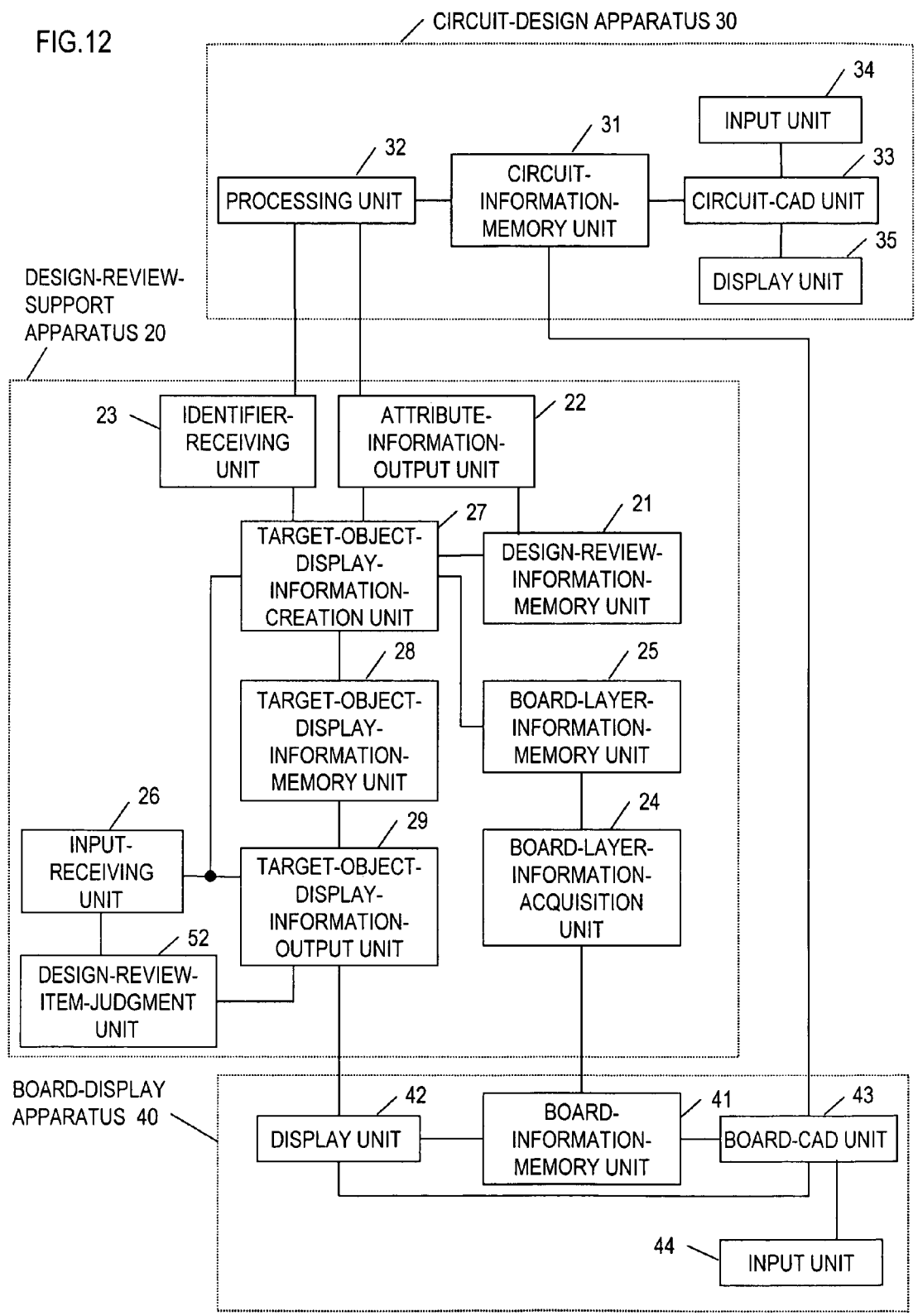
FIG. 12 is a block diagram showing the construction of the design-review system of a second embodiment of the invention.

FIG. 12 is a block diagram showing the construction of the design-review system of this embodiment. In FIG. 12, the design-review system comprises: a design-review-support apparatus 20, circuit-design apparatus 30 and board-display apparatus 40.

The design-review-support apparatus 20 comprises: a design-review-information-memory unit 21, attribute-information-output unit 22, identifier-receiving unit 23, board-layer-information-acquisition unit 24, board-layer-information-memory unit 25, input-receiving unit 26, target-object-display-information-creation unit 27, target-object-display-information-memory unit 28, target-object-display-information-output unit 29 and design-review-item-judgment unit 52.

The design-review-information-memory unit 21 stores design-review information and is the same as the design-review-information-memory unit 12 in the first embodiment, so an explanation of it will be omitted.

The attribute-information-output unit 22 outputs attribute information to the circuit-design apparatus 30. Here, the attribute information is information that indicates the attributes of the target design-review object. This attribute information, for example, can be information that contains the attributes of the target design-review object as is, or can be a command to the design-review-support apparatus 20 to output target-object identifiers that correspond to the attributes of the target design-review object.

The identifier-receiving unit 23 receives target-object identifiers from the circuit-design apparatus 30. The target-object identifiers that the identifier-receiving unit 23 receives are output from the circuit-design apparatus 30 according to the attribute information that is output from the attribute-information-output unit 22, and these target-object identifiers identify a target design-review object that corresponds to the attributes indicated by that attribute information.

Here, the output of attribute information and the output of target-object identifiers is the transfer of attribute information and target-object identifiers between the design-review-support apparatus 20 and circuit-design apparatus 30, and that transfer can be in any form. For example, the attribute-information unit 22 can send attribute information to the circuit-design apparatus 30, or attribute information can be given to the circuit-design apparatus as arguments when the circuit-design apparatus 30 is activated. Moreover, the attribute-information-output unit 22 can transfer attribute information by writing the attribute information in a specified memory, and having the circuit-design apparatus 30 read the attribute information from that memory.

The board-layer-information-acquisition unit 24 acquires board-layer information from the board information that is stored in the board-information-memory unit 41 of the board-display apparatus 40. Here, the board-layer information is information that indicates the layer of the circuit board where the target object is located. From this board-layer information, it is possible to know on which layer a specific target object exists. The layers of the circuit board, for example, are the top surface or bottom surface of the circuit board, and in some cases could include one or more layers between the top surface and bottom surface. The timing at which the board-layer-information-acquisition unit 24 acquires board-layer information can be any timing as long as the board-layer information at the time when the target-object-display-information-creation unit 27 uses the board-layer information matches the board information. For example, the timing can be triggered by a specific event (for example, a change in board information, activation of the design-review-support apparatus 20, etc.), or can be a specified period.

The board-layer-information-memory unit 25 stores the board-layer information that is acquired by the board-layer-information-acquisition unit 24. The board-layer-information-memory unit 25 can be realized by a specific recording medium (for example, a semiconductor memory, magnetic disk, optical disk or the like). The memory of the board-layer-information-memory unit 25 can be a temporary memory such as a volatile recording medium like RAM, or can be a long-term memory such as a non-volatile recording medium.

The input-receiving unit 26 receives specific input and is the same as the input-receiving unit 15 of the first embodiment, so an explanation of it will be omitted here.

The target-object-display-information-creation unit 27 creates target-object-display information that contains the target-object-identifiers received by the identifier-receiving unit 23. This target-object-display information is such that, a design-review image that includes the target design-review object on the board can be created from this information. The display-method information that is contained in the design-review information is also contained in this target-object-display information. That display-method information, for example, can also be contained in the target-object-display information as a display command. The display-method information that is contained in the target-object-display information corresponds to the target-object identifiers contained in the target-object-display information. Also, the target-object-display information contains the review-point information that is contained in the design-review information. The review-point information that is contained in the target-object-display information corresponds to the target-object identifiers that are contained in the target-object-display information. Moreover, the target-object-display information also contains information that can display a list of design-review items. The target-object-display-information-creation unit 27 stores the created target-object-display information in the target-object-display-information memory unit 28.

The target-object-display-information-memory unit 28 stores the target-object-display information created by the target-object-display-information-creation unit 27 temporarily or long term. This target-object-display-information-memory unit 28 can be realized, for example, by a specified recording medium (semiconductor memory, magnetic disk, optical disk, etc.).

The target-object-display-information-output unit 29 outputs the target-object-display information stored by the target-object-display-information-memory unit 28 to the board-display apparatus 40. Here, in the output of this target-object-display information as well, it is possible to transfer target-object-display information between the design-review-support apparatus 20 and board-display apparatus 40. In other words, similar to the output of attribute information, this transfer can be in any form. The target-object-display-information-output unit 29 outputs design-review items in order for the board-display unit 50 to display a list of design-review items.

The design-review-item-judgment unit 52, according to an instruction that is received by the input-receiving unit 26, determines whether a design-review item has been selected. The design-review-item-judgment unit 52 then gives that judgment result to the target-object-display-information-output unit 29. In the selection of a design-review item, it is possible to select just one design-review item, or to select two or more design-review items.

The circuit-design apparatus 30 is an apparatus that performs circuit design, and comprises: a circuit-information-memory unit 31, processing unit 32, circuit-CAD unit 33, input unit 34 and display unit 35. The circuit-information-memory unit 31 stores circuit information in the same way as the circuit-information-memory unit 11 of the first embodiment, so an explanation of it is omitted here. The circuit information that is stored by the circuit-information-memory unit 31 is information that indicates the construction of the circuit designed in the circuit design process. The processing unit 32 extracts the target-object identifier, which corresponds to the attribute information that is output from the attribute-information-output unit 22, from the circuit information that is stored by the circuit-information-memory unit 31, and outputs that target-object identifier to the identifier-receiving unit 32. Also, the processing unit 32 performs processing related to the circuit design by the circuit-design apparatus 30. The circuit-CAD unit 33 is the same as the circuit-CAD unit 18 of the first embodiment, so an explanation of it is omitted here. Also, the input unit 34 and display unit 35 are the same as the input unit 18a and display unit 18b of the first embodiment, so an explanation of them is omitted here.

Board-display apparatus 40 comprises: a board-information-memory unit 41, display unit 42, board-CAD unit 43 and input unit 44. Based on circuit information that is stored in the circuit-information-memory unit 31, the board-information-memory unit 41 stores board information that was designed by the board-CAD unit 43. The display unit 42 displays a board-pattern diagram that is based on that board information on a specified display device. The display unit 42 may or may not include a display device (for example, a CRT, liquid crystal display or the like) that performs the display. Also, the display unit 42 can be realized by hardware, or can be realized by software, such as the driver that drives the display device. The board-information-memory unit 41, board-CAD unit 43 and input unit 44 are the same as the board-information-memory unit 13, board-CAD unit 19 and input unit 19a of the first embodiment, so an explanation of them is omitted here.

Figure 13:
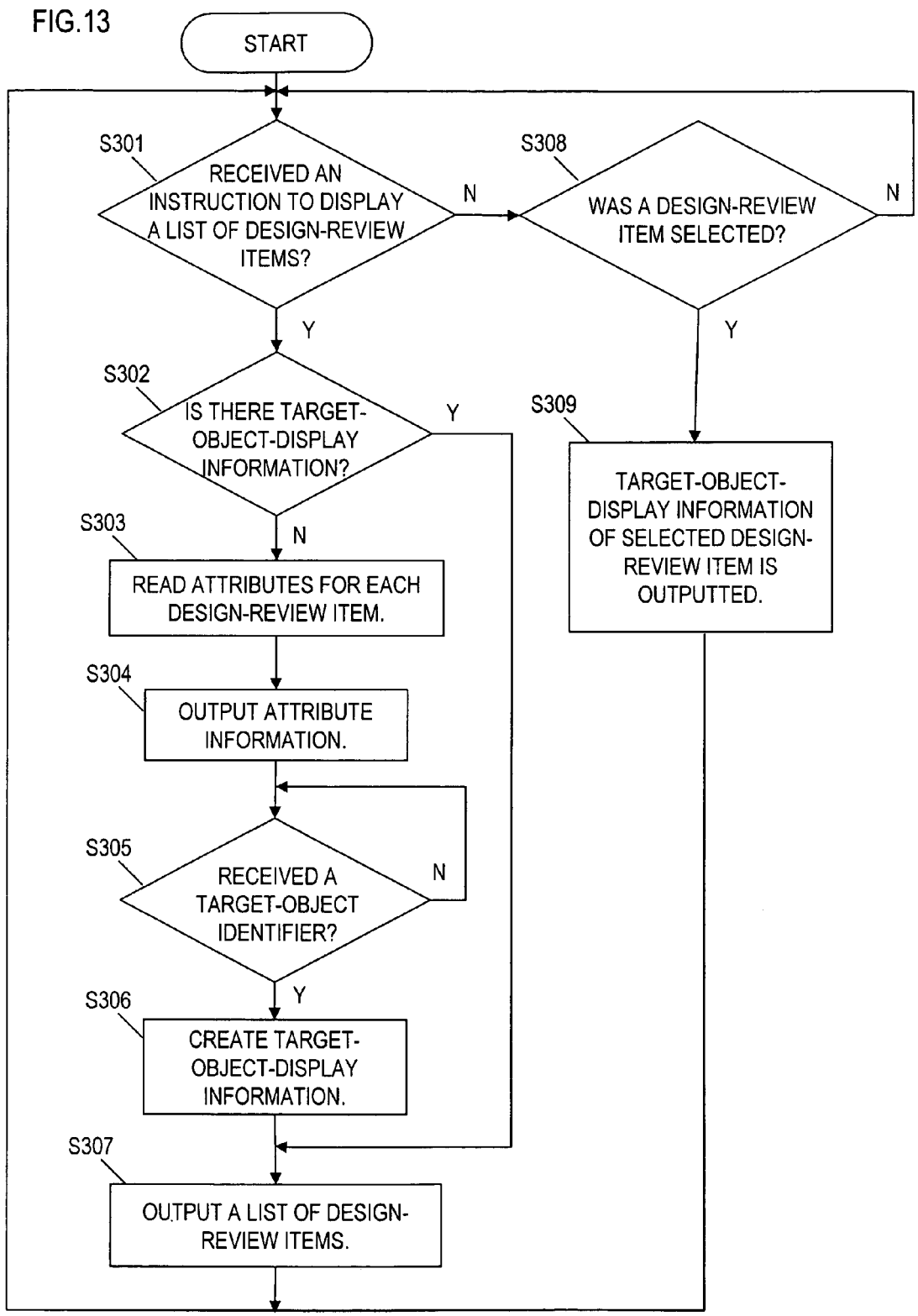
FIG. 13 is a flowchart showing the operation of the design-review-support apparatus of the second embodiment.

Next, the operation of the design-review system of this embodiment will be explained. FIG. 13 is a flowchart showing the operation of the design-review-support apparatus 20 of this embodiment.

(Step S301) The input-receiving unit 26 determines whether or not an instruction to display a list of design-review items has been received. Also, when that instruction has been received, the input-receiving unit 26 gives that instruction to the target-object-display-information-creation unit 27, and the process advances to step S302, otherwise the process advances to step S308.

(Step S302) The target-object-display-information-creation unit 27 determines whether or not target-object-display information is stored in the target-object-display-information-memory unit 28. When target-object-display information is stored, the target-object-display-information-creation unit 27 gives an instruction for outputting the information required for displaying a list of design-review items to the target-object-display-information-output unit 29, and the process advances to step S307, otherwise, it gives an instruction to the attribute-information-output unit 22 to output attribute information, and the process advances to step S303.

(Step S303) The attribute-information-output unit 22 reads attributes for the target design-review object corresponding to each design-review item from the design-review information stored in the design-review-information-memory unit 21.

(Step S304) The attribute-information-output unit 22 creates attribute information based on the read attributes, and outputs that attribute information to the processing unit 32.

After receiving the attribute information that is output from the attribute-information-output unit 22, the processing unit 32 references the circuit-information-memory unit 31 to extract the target-object identifier for the target design-review object that corresponds to the attribute indicated by that attribute information. Also, the processing unit 32 outputs that extracted target-object identifier to the identifier-receiving unit 23.

(Step S305) The identifier-receiving unit 23 determines whether or not a target-object identifier has been received from the circuit-design apparatus 30. When a target-object identifier has been received, the identifier-receiving unit 23 gives that target-object identifier to the target-object-display-information-creation unit 27 and the process advances to step S306, otherwise, the identifier-receiving unit 23 repeats the process of step S305 until a target-object identifier is received.

(Step S306) The target-object-display-information-creation unit 27 creates target-object-display information based on the target-object identifier received from the identifier-receiving unit 23. The target-object-display-information-creation unit 27 uses the display-method information and review-point information for creating that target-object-display information. Also, when an attribute is contained in the design-review information that is related to the layer of the circuit board, the target-object-display-information-creation unit 27 creates the target-object-display information based on the board-layer information that is stored in the board-layer-information-memory unit 25. More specifically, the target-object-display-information-creation unit 27 creates target-object-display information using a target-object identifier for which the board layer indicated by the attribute corresponding to the received target-object identifier (attribute included in the design-review information) matches the layer corresponding to that target-object identifier in the board-layer information (layer indicated by the board-layer information). Also, together with storing that created target-object-display information in the target-object-display-information-memory unit 28, the target-object-display-information-creation unit 27 gives an instruction to the target-object-display-information-output unit 29 based on that target-object-display information to output the information required for displaying a list of design-review items.

(Step S307) The target-object-display-information-output unit 29 outputs information required for displaying a list of design-review items to the board-display apparatus 40. The process then returns to step S301. The display unit 42 displays a list of design-review items on a specified display device based on the information output by the target-object-display-information-output unit 29.

(Step S308) The input-receiving unit 26 determines whether or not an instruction to select a design-review item has been received. When that instruction has been received, the input-receiving unit 26 gives that instruction to the design-review-item-judgment unit 52. The design-review-item-judgment unit 52, according to an instruction from the user that was received by the input-receiving unit 26, determines which design-review item was selected, and gives that judgment result to the target-object-display-information-output unit 29, then the process advances to step S309. When the input-receiving unit 26 has not received an instruction to select a design-review item, the process returns to step S301.

(Step S309) According to the judgment result received from the design-review-item-judgment unit 52, the target-object-display-information-output unit 29 outputs target-object-display information that corresponds to the design-review item selected by the user to the display unit 42. The process then returns to step S301. Based on the target-object-display information output from the target-object-display-information-output unit, the display unit 42 displays the target design-review object related to the selected design-review item on a specified display device using the corresponding display method. Also, the display unit 42 performs a display based on review-point information related to that selected design-review item.

In the flowchart shown in FIG. 13, the process ends when the power is turned OFF or there is an interrupt to end processing. Also, in this flowchart, the process is such that when target-object-display information is stored, the design-review item will be displayed. However, in the case where new board information has been created and it is desired to create new target-object-display information, it is also possible to create target-object-display information even though target-object-display information is stored. Also, in that case, it is also possible to delete the target-object-display information that is stored in the target-object-display-information unit 28.

Next, a detailed example will be used to explain the operation of the design-review system of this embodiment. In this detailed example, the design-review information that is stored by the design-review-information-memory unit 21 is as shown in FIG. 5. Also, the circuit information that is stored by the circuit-information-memory unit 31 is as shown in FIG. 4. Moreover, the board information that is stored by the board-information-memory unit 41 is as shown in FIG. 6. The information shown in FIG. 4 to FIG. 6 is the same as that of the first embodiment, so an explanation of it will be omitted here. Also, there is no target-object-display information stored in the target-object-display-information-memory unit 28.

The design-review-support apparatus 20 of this embodiment and the display device on which the display unit 42 performs a display are as shown in FIG. 8. In FIG. 8, the PC itself corresponds to the design-review-support apparatus 20, and the display corresponds to the display device on which the display unit 42 performs a display. This design-review-support apparatus 20, circuit-design apparatus 30 and board-display apparatus 40 can be connected by a specified line (not shown in the figure). Also, the design-review-support apparatus 20, circuit-design apparatus 30 and board-display apparatus 40 can be realized by the CPU and memory of the PC and a program that is read and executed by that CPU.

First, the operation of acquiring board-layer information by the board-layer-information-acquisition unit 24 will be explained. The board-layer-information-acquisition unit 24 references the board information shown in FIG. 6, and from that board information, acquires board-layer information that comprises information indicating a target-object identifier and placement surface that corresponds to that target-object identifier. FIG. 14 is a drawing showing that acquired board-layer information. As shown in FIG. 14, from the board-layer information it is possible to know which board layer (here this will only be the top surface (TOP) or bottom surface (BOTTOM)) the target object corresponding to a target-object identifier is located.

The user displays the screen shown in FIG. 8 by performing a control operation using the keyboard or mouse shown in FIG. 8. Also, when the user uses the mouse to click on the 'YES' button, the input-receiving unit 26 determines that an instruction has been received to display a list of design-review items (step S301), and gives that instruction to display a list of design-review items to the target-object-display-information-creation unit 27. At this time, since there is no target-object-display information stored, the target-object-display-information-creation unit 27 references the target-object-display-information-memory unit 28 and determines that there is no target-object-display information stored (step S302), and gives an instruction to the attribute-information-output unit 22 to output attribute information.

After that, the attribute-information-output unit 22 reads the attributes 'Analog, Digital', 'Crystal' and 'IC (TOP)' for each design-review item from the design-review-information shown in FIG. 5 (step S303). Also, the attribute-information-output unit 22 creates attribute information, which is a command to acquire target-object identifiers corresponding to those attributes. As shown in FIG. 15, the attribute-information-output unit 22 has a method of creating commands corresponding to the attributes, and creates attribute information based on that method. More specifically, the attribute-information-output unit 22 creates the command 'Select (netkind, Analog), Select (netkind, Digital) for the attributes 'Analog, Digital', creates the command 'Select (refid, "X*")' for the attribute 'Crystal', and creates the command 'Select (refid, "IC*")' for the attribute 'IC (TOP)'. The 'TOP' of the attribute 'IC (TOP)' is used after receiving the target-object identifier, and is not included in the attribute-information command. Also, here, the case of creating commands by referencing a table was explained, however, it is also possible to create commands using specific functions.

After the attribute-information-output unit 22 correlates the attribute information (commands) with the IDs of the design-review items (records) in the design-review information and outputs it to the processing unit 32 (step S304), the processing unit 32 references the circuit information shown in FIG. 4 that is stored by the circuit-information-memory unit 31, and performs processing according to the received commands. For example, for the commands 'Select (netkind, Analog)' and 'Select (netkind, Digital), the processing unit 32 extracts the target-object identifiers 'NET106, NET107, NET109 and NET110' for the records having the attribute value 'Analog' and corresponding to the attribute 'netkind', and extracts the target identifiers 'NET103 and NET104' for the records having the attribute value 'Digital' and corresponding to the attribute 'netkind'. Also, for the command 'Select (refid, "X*")' the processing unit 32 extracts the target-object identifier starting with 'X', or in other words, the target-object identifier 'X001'. Moreover, for the command 'Select (refid, "IC*")', the processing unit 32 extracts the target-object identifier starting with 'IC', or in other words, the target-object identifier 'IC8001'. This is because the target-object identifiers corresponding to the circuit elements 'Crystal' and 'IC' are set so that they start with 'X' and 'IC', respectively.

After the processing unit 32 has extracted these target-object identifiers, it correlates the extracted target-object identifiers with the IDs of the respective design-review items, and outputs them to the identifier-receiving unit 23. In other words, it correlates the target-object identifiers 'NET106, NET107, NET109 and NET110' corresponding to 'Analog', and the target-object identifiers 'NET103 and NET104' corresponding to 'Digital' with ID=1 and outputs them. Also, it correlates the target-object identifier 'X001' with ID=2 and outputs it, and correlates the target-object identifier 'IC8001' with ID=3 and outputs it.

The identifier-receiving unit 23 receives the target-object identifiers output from the processing unit 32 (step S305), and gives the target-object identifiers to the target-object-display-information-creation unit 27. After receiving the target-object identifiers from the identifier-receiving unit 23, the target-object-display-information-creation unit 27 acquires display-method information and review-point information, which correspond to the IDs of the design-review items correlated to the target-object identifiers, from the design-review-information-memory unit 21. Also, in regards to the design-review item having ID=3, since there is an attribute related to the board layer (In other words, there is an attribute indicating that design-review object is located on the top surface of the board), the target-object-display-information-creation unit 27 references the board-layer information and determines whether or not the target design-review object corresponding to the target-object identifier 'IC8001' is located on the top surface of the board. In the board-layer information shown in FIG. 14, the target-object identifier 'IC8001' is located on the top surface (TOP) of the board, so the target-object-display-information-creation unit 27 continues to create target-object-display information. However, supposing the board-layer information indicates that the target-object identifier 'IC8001' is located on bottom surface of the board, the target-object-display-information-creation unit 27 does away with (deletes) the target-object identifier 'IC8001', and does not create target-object-display information for that target-object identifier.

The target-object-display-information-creation unit 27 has a display-command-creation function, which is a function for creating a display command that corresponds to the display method, that it correlates with the display method. FIG. 16 is a drawing showing the correlation between the display method and display-command-creation function. By inputting the target-object identifier as the argument of this function, the target-object-display-information-creation unit 27 creates the display command. For example, since the IC is to be displayed in red, by using FuncO2 (IC8001), the target-object-display-information-creation unit 27 creates the display command 'Setcolor (IC8001, red)'. Also, the target-object-display-information-creation unit 27 creates review-point information and target-object-display information having a display command for each design-review item (step S306). FIG. 17 is a drawing showing the target-object-display information that was created by the target-object-display-information-creation unit 27. In FIG. 17, the attribute and display method of the target design-review object is included in the target-object-display information, however, this information is shown to simplify the explanation and does not need to be included in the target-object-display information. Moreover, in regards to the target-object identifier as well, the target-object identifier is included in the display command, so it does not need to be included in the target-object-display information. Here, including the target-object identifier in the display commands may be including the target-object as is in the display command, or can be including the target-object in the display command after performing a specified conversion.

The target-object-display-information-creation unit 27 stores the created target-object-display information in the target-object-display-information-memory unit 28. Moreover, the target-object-display-information-creation unit 27 gives an instruction to the target-object-display-information-output unit 29 to output the information required for displaying a list of design-review items. After doing that, the target-object-display-information-output unit 29 reads the 'Target design-review object attributes' for each design-review item from the target-object-display information stored in the target-object-display-information-memory unit 28, and outputs those attributes to the display unit 42 (step S307). As a result, the display unit 42 displays a list of design-review items on the display device (the PC display shown in FIG. 8) as shown in FIG. 9. When there is no 'Review-point Information' in the target-object-display information, the 'Target design-review object attributes' are output to the display unit 42, and the display unit 42 can display that information.

Figure 18:
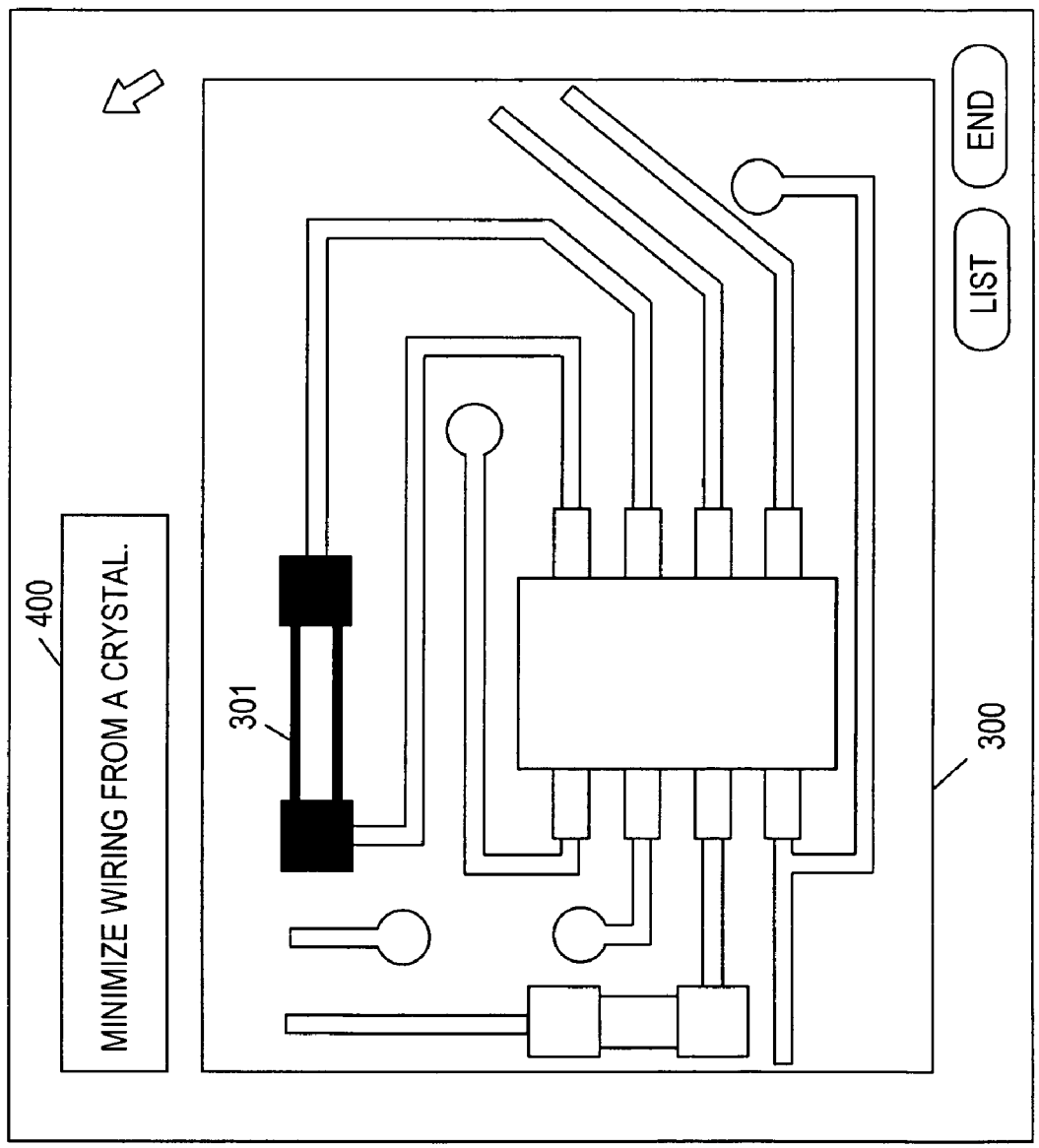
FIG. 18 is a drawing showing an example of the display in the second embodiment.

In this example, the user selects 'Crystal' from the list of design-review items. In other words, the user clicks on the 'Selection' button corresponding to crystal, and the input-receiving unit 26 receives an instruction for that selection (step S308), and gives that instruction to the design-review-item-judgment unit 52. The design-review-item-judgment unit 52 determines that the second design-review item, or in other words, the design-review item having ID=2 was selected, and gives that judgment result to the target-object-display-information-output unit 29. As a result, the target-object-display-information-output unit 29 reads the target-object-display information corresponding to crystal, or in other words, the target-object-display information comprising the display command 'Select (X001)' and the review-point information from the design-review item corresponding to ID=2, and outputs that target-object-display information to the display unit 42 (step S309). The display unit 42 then performs a display according to the received display command 'Select (X001)' and a display based on the review-point information. FIG. 18 is a drawing showing a board-pattern diagram 300 that includes the target design-review object that is displayed on the display, and a display 400 based on the review-point information. In the board-pattern diagram 300, the crystal 301 is selectively displayed (for example, highlighted). This selective display can be performed by changing the colors of the crystal 301 and the other target objects, or by having the crystal 301 flash, or display the crystal 301 darker than other target objects, or any other display method as long as it is possible to distinguish the crystal 301 from other target objects. By looking at this display shown in FIG. 18, the user is able to know that in the board-pattern diagram 300 the wiring for the crystal 301 is long. Therefore, the user must once again perform processing with the board-CAD unit 43 to create board information from the circuit information. When the user clicks on the 'List' button, the display returns to the display shown in FIG. 9 (steps S301, S302, S307), and when the user clicks on the 'End' button, the display returns to the display shown in FIG. 8.

In this detailed example, the case was explained in which the attribute-information-output unit 22 creates commands corresponding to the attributes, however, it is also possible to store commands corresponding to the attributes beforehand in the design-review-information-memory unit 21.

As described above, the design-review system of this embodiment, together with outputting attribute information, creates and outputs target-object-display information that includes the target-object identifier for the target design-review object received according to the output of that attribute information. Therefore, in addition to being able to achieve the same effect as that of the first embodiment, by simply adding the design-review-support apparatus 20 of this embodiment to the circuit-design apparatus 30 and board-display apparatus 40, it is possible to easily construct a system to perform design review.

Moreover, it is possible for the target-object-display-information-output unit 29 to output target-object-display information corresponding to a design-review item that was selected by the user. Therefore, it is possible for the user to perform a design review for just a desired design-review item.

In this embodiment, the case was explained in which the display unit 42 of the board-display apparatus 40, based on target-object-display information received from the target-object-display-information-output unit 29, displays a board-pattern diagram that includes the target design-review object. However, instead of the board-display apparatus 40, it is also possible to use a board-output apparatus that comprises an output unit that outputs a design-review image (board-pattern diagram) that includes an image of the target design-review object on the board based on target-object-design information and board information. This output unit can be a transmission unit that sends the design-review image to a specified apparatus, a printer that prints the design-review image, or the like. It is also possible for this output unit to include or not include an output device (printer, modem, etc.). Moreover, this output unit can be realized using hardware, or can be realized using software such as a driver that drives an output device.

Also, in this embodiment, the case was explained in which display-method information and review-point information were included in the design-review information, however, it is also possible for the design-review information to include just one of these or neither of these. In that case, information corresponding to the display-method information is also not included in the target-object-display information.

Also, in this embodiment, the case was explained in which the design-review information contained an attribute related to the board layer, however, it is possible for the design-review information not to contain an attribute related to the board layer. In the case where the design-review information does not contain an attribute related to the board layer, the design-review-support apparatus 20 does not need to comprise a board-layer-information-acquisition unit 24 or board-layer-information-memory unit 25.

Moreover, in this embodiment, the case was explained in which the target-object-display-information-creation unit 27 creates target-object-display information related to each design-review item contained in the design-review-information-memory unit 21, after which the target-object-display-information-output unit 29 outputs that target-object-display information for each design-review item. However, it is also possible for the target-object-display-information-creation unit 27 to create target-object-display information for only specified design-review items according to input from the user. In this case, the design-review-item-judgment unit 52 can give the judgment result to the target-object-display-information-creation unit 27.

Furthermore, in this embodiment, the case was explained in which the attribute information was a command, however, this is only one example, and it is also possible for the target-object-display information to contain only a target-object identifier corresponding to the target design-review object, or to contain only the target-object identifier and display information. When only the target-object identifier is contained in the target-object-display information, the target-object-display-information-creation unit 27 creates target-object-display information that contains only the target-object identifier received by the identifier-receiving unit 23, however, this can also be referred to as creating target-object-display information. When only the target-object identifier is contained in the target-object-display information, the board-display apparatus 40 displays the target design-review object that is identified by that target-object identifier using a preset display method. The preset display method could be, for example, a method of emphasizing the target design-review object such as changing the display color of the target design-review object that corresponds to the received target-object identifier, causing the target design-review object to flash, or other method that highlights the target design-review object.

Also, in this embodiment, the case was explained in which the design-review-support apparatus 20 receives a target-object identifier from the circuit-design apparatus 30, and outputs target-object-display information that contains at least that target-object identifier. However, it is also possible, for example, for the design-review-support apparatus 20 to be an apparatus that just outputs attribute information that indicates the attribute of a target design-review object of the design-review item. In this case, the circuit-design apparatus 30 that received that attribute information extracts the target-object identifier that corresponds to that attribute, and by giving that extracted target-object identifier to the board-display apparatus 40, the board-display apparatus 40 can display the target design-review object. That circuit-design apparatus 30 and board-display apparatus 40 can be construction such that they are the same apparatus.

Moreover, in this embodiment, the case was explained in which the design-review-support apparatus 20 comprises: a board-layer-information-acquisition unit 24 that acquires board-layer information from a board-information-memory unit 41, and a board-layer-information-memory unit 25 that stores that board-layer information. However, it is also possible for this design-review-support apparatus 20 to comprise: a board-information acquisition unit that acquires board information from the board-information-memory unit 41, and a board-information-memory unit that stores that board information. Also, it is possible for the target-object-display-information-creation unit 27 to use the board information acquired by the board-information-acquisition unit, and the attribute related to the board included in the attribute of the target design-review object (for example, an attribute related to the position of the target design-review object on the board) to create target-object-display information. In this case, the board information acquired by the board-information-acquisition unit is information related to the target object on the circuit board, and can be the same as the board information that is stored in the board-information-memory unit 41. However, it is also possible for it to be part of that board information. For example, it is possible to acquire only information from the board information stored in the board-information-memory unit 41 that relates to the target-object identifier and location.

Furthermore, in this embodiment, the case was explained in which the circuit-design apparatus 30 comprises a circuit-CAD unit 33, and the board-display apparatus 40 comprises a board-CAD unit 43, however, it is also possible for the circuit-design apparatus 30 to not comprise a circuit-CAD unit 33. Also, it is possible for the board-display apparatus 40 to not comprise a board-CAD unit 43. It is also possible to construct both the circuit-CAD unit 33 and board-CAD unit 43 or just one of the two as apparatuses separate from the circuit-design apparatus 30 and board-display 40 apparatus of this embodiment, and such that they exchange information with the circuit-information-memory unit 31 and board-information-memory unit 41 by way of a specified communication line or specified recording medium. Also, of the input units 34, 44 and display unit 35 connected to the circuit-CAD unit 33 and board-CAD unit 43, these apparatuses can comprise all or some of these units.

Also, in each of the embodiments described above, it is possible for the design-review-output apparatus or design-review system to be constructed as a system comprising a plurality of apparatuses, or constructed as a standalone single apparatus. Here, when constructed as a system, each apparatus can be connected by way of a wired or wireless communication line.

Also, in each of the embodiments described above, the case was explained in which the display was performed for each design-review item, however, it is also possible to perform the display for a plurality of design-review items at the same time. For example, in the case of displaying analog wiring in blue, displaying digital wiring in red, displaying crystals in yellow and displaying ICs in green, it is possible to distinguish each of these even when they are displayed at the same time, so it is possible to display all of these target design-review objects at the same time.

Moreover, in each of the embodiments described above, it is also possible to display the target design-review object that was not included in the previous created design-review image. In other words, it is possible to display the difference between the current and previous design-review image. For example, in the target-object-display information shown in FIG. 17, a 'Previous-extraction flag' is correlated with and set for each target-object identifier. When the target-object-display-information-creation unit 27 stores new target-object-display information in the target-object-display-information-memory unit 28, the previous-extraction flag corresponding to the target-object identifier stored up to that time is set to '1'. Also, the previous-extraction flag corresponding to the target-object identifier being newly stored at that time is set to '0'. In that case, for example, when it is desired to display just the target design-review object corresponding to the target-object identifier newly received by the identifier-receiving unit 23, the display need only be performed for the target-object identifier whose previous-extraction flag is '0'.

Also, in each of the embodiments described above, the case was explained in which a design-review image and target-object-display information related to the design-review item that was selected by the input received by the input-receiving units 15, 26 were output. However, this is just one example, and it is possible, for example, to output a design-review image and target-object-display information related to each review-design item at a specified timing. That timing can be, for example, after each specified period (for example, every minute), or could be timing that is triggered by a specified event, or could be some other timing.

Moreover, in each of the embodiments described above, the case was explained in which a design-review item was selected after displaying a list of design-review items. However, this is just one example, and, for example, it is also possible to receive an instruction to output a design-review image or target-object-display information related to each design-review item without displaying a list, or, as described above, to output a design-review image or target-object-display information related to each design-review item at specified periods of time.

Furthermore, in each of the embodiments described above, it is possible for each process (each function) to be performed by a single apparatus (system), or to be divided up among a plurality of apparatuses.

Also, in each of the embodiments described above, it is possible to construction each of the component elements using special hardware, or to realize the component elements that can be realized using software by executing a program. For example, it is possible to realize each of the component elements by having a program-execution unit such as a CPU read and execute a software program that is recorded on a recording medium such as a hard disc or semiconductor memory. The software for realizing the design-review-output apparatus of the embodiments above can be a program as described below. That is, this program causes a computer to execute: an identification step of identifying the target-object identifier that corresponds to a target design-review object based on circuit information, which is information that correlates the target-object identifiers that identify the target objects in a circuit with the attributes of the target objects, and design-review information, which is information containing the attribute for the target design-review object or target object for which design review is being performed for one or more design-review items related to a circuit board design; an image-creation step of creating, based on the target-object identifiers identified in the identification step and board information that correlates and contains the target-object identifiers and position on the board of the target-objects identified by the target-object identifiers, a design-review image, which is an image that includes the target design-review objects on the board; and an output step of outputting the design-review image that was created in the image-creation step.

Moreover, the software that realizes the design-review-support apparatus of the embodiment above, can be a program as described below. That is, this program causes a computer to execute an attribute-information-output step of outputting attribute information, which is information indicating the attribute of the target design-review object based on design-review information, which is information containing the attribute of the target design-review object, or target object for which design review is being performed, for one or more design-review items related to a circuit board design.

Furthermore, this program can be a program that causes a computer to further execute: an identifier-receiving step of receiving a target-object identifier that identifies the target design-review object that corresponds to the attribute of the target design-review object indicated by the output attribute information; a target-object-display-information-creation step of creating target-object-display information, which is information that contains the target-object identifier received in the identifier-receiving step; and a target-object-display-information-output step of outputting the target-object-display information created in the target-object-display information-creation step.

The programs described above do not include an output step of outputting information, or a receiving step of receiving information, or other steps of performing processes that are performed by the hardware, such as the processing performed by a display device, modem or interface card in the output step (processing that can only be performed by the hardware).

Also, this program can be given to the computer using a medium that can be read by the computer. It is possible to use various kinds of media such as a recording medium or transmission medium as the medium that can be read by a computer. In the case of providing this program to a third party, it is possible to provide the program by distributing the recording medium described above, or by way of a telecommunications line such as the Internet. When providing the program by way of a telecommunications line, the instructions of the program are expressed by an electronic signal, optical signal, magnetic signal or the like, and by placing and transmitting that signal on a carrier wave, it is possible to provide that program by way of a communications line that uses a transmission medium such as co-axial cable, copper wire or fiber optics. Furthermore, the computer that executes this program can be a single computer or can be a plurality of computers. In other words, processing can be concentrated and executed by one computer, or can be divided up and executed by a plurality of computers.

Moreover, in each of the embodiments described above, it is possible for the design-review-output apparatus or design-review-support apparatus 20 to be constructed such that they are standalone, or they can be constructed as a system by way of a communication line, etc.

Figure 19:
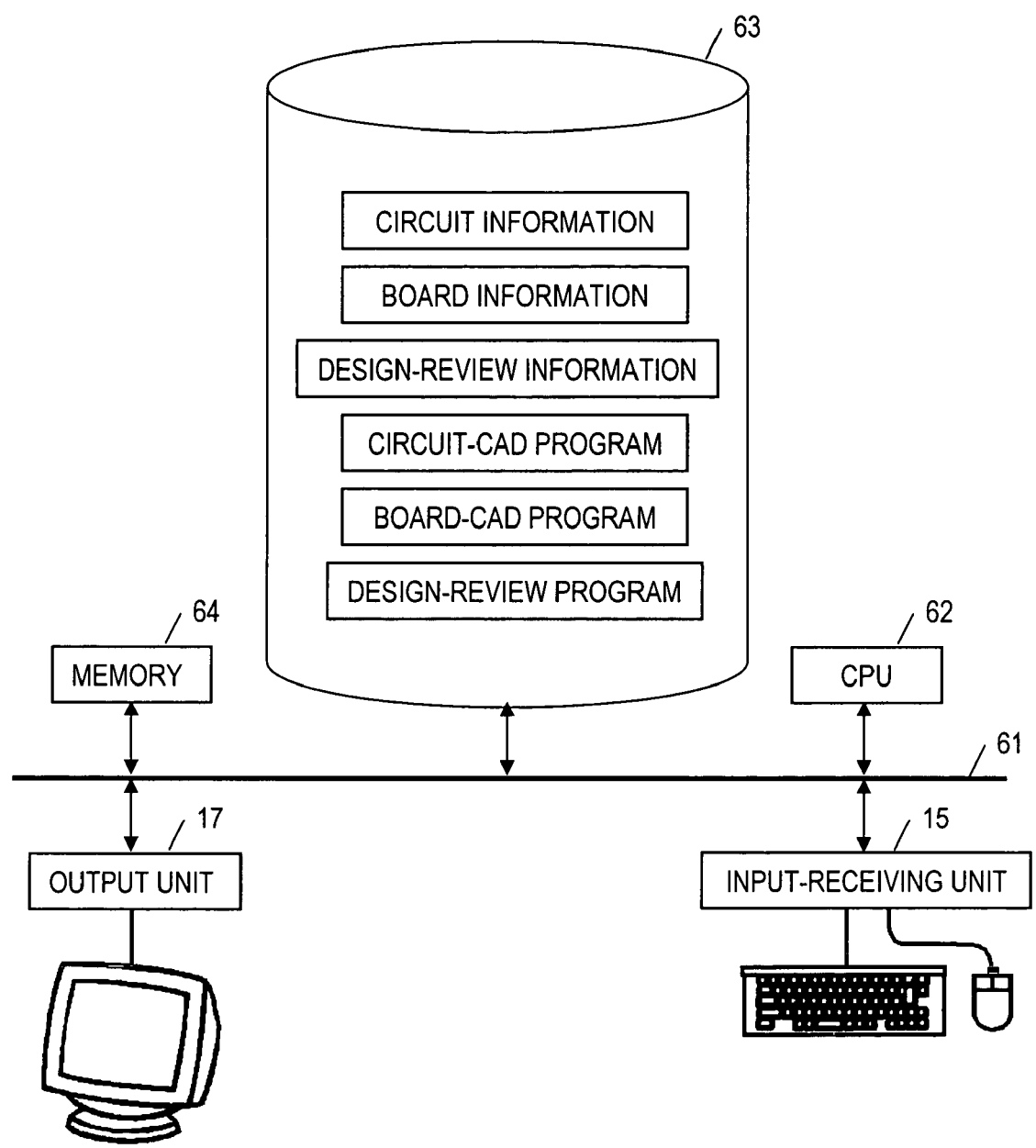
FIG. 19 is a drawing showing an example of standalone construction.

For example, as shown in FIG. 19, the design-review-output apparatus can be a standalone apparatus that comprises: a CPU 62, memory unit 63 that stores circuit information, board information, design-review information, a circuit-CAD program, a board-CAD program and design-review program; a memory 64 that is used when executing the programs; an input-receiving unit 15 that is connected to a keyboard or mouse; and an output unit 17 that is connected to a display, such that all the units are connected together by way of a bus 61. Here, the circuit-CAD unit 18 or board-CAD unit 19 is realized when the CPU 62 executes the circuit-CAD program or board-CAD program, and the identification unit 14, image-creation unit 16 and design-review-item-judgment unit 51 are realized by executing the design-review program. Here, the case was explained in which each of the component elements is realized by software, however, it is also possible to construct a standalone apparatus by realizing each of the component elements using hardware. Moreover, in FIG. 19, the design-review-output apparatus of first embodiment was explained, however, it is also possible to construct the design-review-support apparatus 20 of second embodiment, or two or more arbitrary apparatuses such as the design-review-support apparatus 20, circuit-design apparatus 30 and board-display apparatus 40 as a standalone apparatus in the same way as in FIG. 19.

Figure 20:
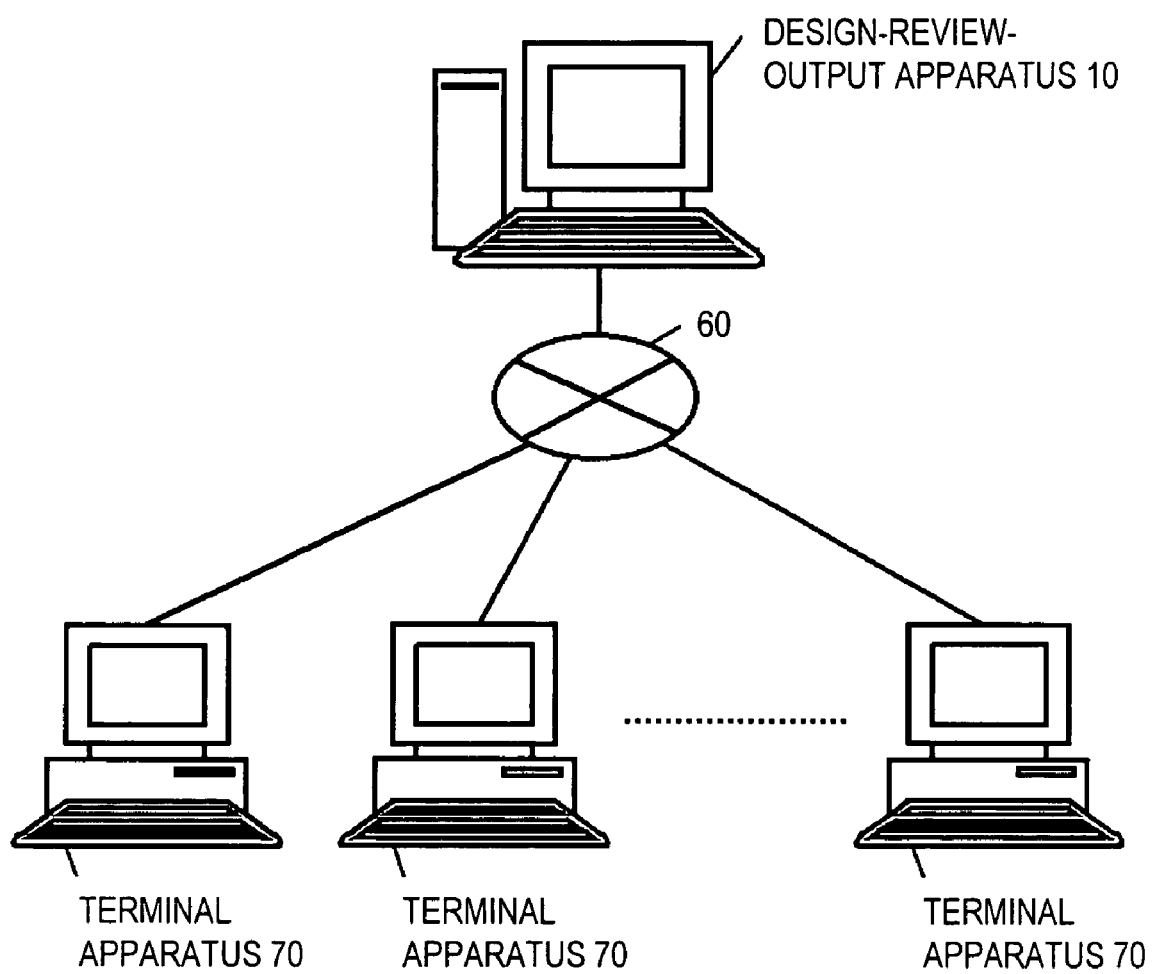
FIG. 20 is a drawing showing an example of system construction.

Also, as shown in FIG. 20, it is possible to construct a system by connecting the design-review-output apparatus 10 to one or more terminal apparatuses 70 by way of a communications line 60 such as the Internet or Intranet. In that case, the user performs input to the design-review-output apparatus 10 by operating a terminal apparatus 70, and a design-review image is sent from the design-review-output apparatus 10 to the terminal apparatus 70 by way of the communications line 60, and displayed or printed out by the terminal apparatus 70. Here, the case of the design-review-output apparatus of first embodiment was explained, however, it is also possible to construct the design-review-support apparatus 20 of second embodiment, or a system of two or more arbitrary apparatus such as the design-review-support apparatus 20, the circuit-design apparatus 30 and board-display apparatus 40 in the same way as in FIG. 20.

In this way, the design-review-output apparatus of this invention makes it possible to adequately perform design review of a circuit board, and can be used as a system for performing design review of a designed board.

The disclosure of Japanese Patent Application No. 2004-003872 filed Jan. 9, 2004 including the specifications, drawings and claims is incorporated herein by reference in its entirety.

The embodiments described above do not limit the technical scope of the present invention, and in addition to the embodiments already disclosed, various changes or applications are possible within the range of the invention.

What is claimed is:

1. A design-review-support apparatus for performing a design review of a circuit board designed by a circuit-design apparatus for carrying out a circuit board design and including a circuit-information-memory unit storing circuit information wherein objects that are component elements of the circuit board are correlated with target object identifiers, said apparatus comprising:

a design-review-information-memory unit operable to store design-review information that contains attributes of target design-review objects indicating features of the target design-review object, for each one or more design-review items related to a circuit board design;

an attribute-information-output unit operable to output attribute information that indicates the target design-review object attributes toward the circuit-design apparatus;

an identifier-receiving unit that is operable to, according to the output of the attribute information, receive target-object identifiers that identify the target design-review objects corresponding to the target design-review object attributes that are indicated by the attribute information, from the circuit-information-memory unit of the circuit-design apparatus;

a target-object-display-information-creation unit operable to create target-object-display information that includes the target-object identifiers that were received by the identifier-receiving unit; and a target-object-display-information-output unit operable to output the target-object-display information that was created by the target-object-display-information-creation unit;

wherein the circuit information contains the design-review items corresponding to the target design-review object attributes, and the design-review item is one of items for checking whether analog wiring and digital wiring are separated, for checking the wiring from a crystal, and for checking a position of IC on the board.

2. The design-review-support apparatus of claim 1 wherein the attribute information is a command to output the target-object identifiers that correspond to the target design-review object attributes to the design-review-support apparatus.

3. The design-review-support apparatus of claim 1 further comprising:

a board-layer-information-memory unit operable to store board-layer information that indicates the layer on the circuit board where target objects are located; and wherein attributes related to the layer where the target design-review objects are located are also included in the attributes for the target design-review objects; and the target-object-display-information-creation unit creates target-object-display information that, of the target-object identifiers that were received by the identifier-receiving unit, includes the target-object identifiers for which the layer indicated by the attributes corresponding to the target-object identifiers where the target design-review objects are located, matches the layer indicated by the board-layer information where that target design-review objects are located.

4. The design-review-support apparatus of claim 1 further comprising:

a board-information-memory unit operable to store board information related to target objects on a circuit board; and wherein attributes related to the board of a target design-review object are included in the attributes of the target design-review object; and the target-object-display-information-creation unit creates target-object-display information by using the board information and attributes related to the board of the target design-review object.

5. The design-review-support apparatus of claim 1 wherein the design-review information includes display-method information related to a display method for displaying the target design-review objects, the display-method information being correlated with the attributes of the target design-review objects; and the target-object-display-information-creation unit creates the target-object-display information that includes the display-method information that corresponds to the target-object identifiers included in the target-object-display information.

6. The design-review-support apparatus of claim 5 wherein the target-object-display information is a command for displaying the target objects identified by the target-object identifiers that are included in that target-object-display information using a display method indicated by the display-method information corresponding to the target-object identifiers.

7. The design-review-support apparatus of claim 1 wherein the target-object-display-information-output unit outputs the target-object-display information for each the design-review item.

8. The design-review-support apparatus of claim 7 further comprising a design-review-item-judgment unit operable to, according to an instruction from the user, judge which design-review items were selected; and wherein the target-object-display-information-output unit outputs the target-object-display information corresponding to the design-review items that the design-review-item-judgment unit judged were selected by the user.

9. The design-review-support apparatus of claim 1 wherein the design-review information contains review-point information that indicates review points related to the target design-review objects for each design-review item; and the target-object-display-information-creation unit creates target-object-display information that includes the review-point information corresponding to the target-object identifiers included in the target-object-display information.

10. A design-review system comprising:

the design-review-support apparatus of any one of the claims 1 and 2 to 9;

a circuit-design apparatus that stores circuit information, which correlates and contains target-object identifiers that identify target objects in a circuit, and the attributes of those target objects, and outputs the target-object identifiers, which correspond to the attribute information that is output from the attribute-information-output unit, to the design-review-support apparatus; and a board-output apparatus that stores board information, which contains and correlates target-object identifiers and the position on the board of the target objects that are identified by the target-object identifiers, and based on the target-object-display information that is output from the target-object-display-information-output unit and the board information, outputs a design-review image, which is an image that includes the target design-review objects on the board.

11. A design-review-support method for performing a design review of a circuit board designed by a circuit-design apparatus for carrying out a circuit board design and including a circuit-information-memory unit storing circuit information wherein objects that are component elements of the circuit board are correlated with target object identifiers, said apparatus comprising an attribute-information-output step of outputting attribute information, which is information indicating the attributes of the target design-review objects toward the circuit-design apparatus based on design-review information that contains the attributes of the target design-review objects indicating features of the target design-review object, for each one or more design-review items related to a circuit board design;

an identifier-receiving step of receiving target-object identifiers that identify the target design-review objects that correspond to the attributes of the target design-review objects indicated by the output attribute information;

a target-object-display-information-creation step of creating target-object-display information that contains the target-object identifiers received in the identifier-receiving step; and a target-object-display-information-output step of outputting the target-object-display information created in the target-object-display information-creation step;

wherein the circuit information contains the design-review items corresponding to the target design-review object attributes, and the design-review item is one of items for checking whether analog wiring and digital wiring are separated, for checking the wiring from a crystal, and for checking a position of IC on the board.

12. A computer readable recording medium bearing a program for causing a computer to execute an attribute-information-output step of outputting attribute information, which is information indicating the attributes of the target design-review objects toward a circuit-design apparatus for carrying out a circuit board design and including a circuit-information-memory unit storing circuit information wherein objects that are component elements of the circuit board are correlated with target object identifiers, based on design-review information that contains the attributes of the target design-review objects indicating features of the target design-review object, for each one or more design-review items related to a circuit board design;

an identifier-receiving step of receiving target-object identifiers that identify the target design-review objects that correspond to the attributes of the target design-review objects indicated by the output attribute information;

a target-object-display-information-creation step of creating target-object-display information that contains the target-object identifiers received in the identifier-receiving step; and a target-object-display-information-output step of outputting the target-object-display information created in the target-object-display information-creation step;

wherein the circuit information contains the design-review items corresponding to the target design-review object attributes, and the design-review item is one of items for checking whether analog wiring and digital wiring are separated, for checking the wiring from a crystal, and for checking a position of IC on the board.

* * * * *